(12) United States Patent
Ibusuki et al.

(10) Patent No.: US 11,380,710 B2
(45) Date of Patent: Jul. 5, 2022

(54) SEMICONDUCTOR DEVICE AND METHOD FOR MANUFACTURING SEMICONDUCTOR DEVICE

(71) Applicant: SONY SEMICONDUCTOR SOLUTIONS CORPORATION, Kanagawa (JP)

(72) Inventors: Yuji Ibusuki, Kagoshima (JP); Daisaku Okamoto, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 122 days.

(21) Appl. No.: 16/488,739

(22) PCT Filed: Jan. 18, 2018

(86) PCT No.: PCT/JP2018/001323
§ 371 (c)(1),
(2) Date: Aug. 26, 2019

(87) PCT Pub. No.: WO2018/163605
PCT Pub. Date: Sep. 13, 2018

(65) Prior Publication Data
US 2021/0134838 A1    May 6, 2021

(30) Foreign Application Priority Data
Mar. 8, 2017 (JP) .............................. JP2017-043926

(51) Int. Cl.
*H01L 27/12* (2006.01)
*H01L 21/02* (2006.01)
(Continued)

(52) U.S. Cl.
CPC .... *H01L 27/1203* (2013.01); *H01L 21/02236* (2013.01); *H01L 21/84* (2013.01);
(Continued)

(58) Field of Classification Search
CPC .......... H01L 29/42372–42384; H01L 27/1203
See application file for complete search history.

(56) References Cited

U.S. PATENT DOCUMENTS

| 5,116,771 A | 5/1992 | Karuikar |
| 2003/0025135 A1* | 2/2003 | Matsumoto ......... H01L 29/6659 257/288 |

FOREIGN PATENT DOCUMENTS

| JP | S57-010266 | 1/1982 |
| JP | H09-186167 | 7/1997 |

(Continued)

OTHER PUBLICATIONS

JP 2000-216391 machine translation (Year: 2000).*

(Continued)

*Primary Examiner* — Vincent Wall
(74) *Attorney, Agent, or Firm* — Sheridan Ross P.C.

(57) ABSTRACT

To provide a semiconductor device capable of reducing a parasitic capacitance, securing high reliability, and suppressing an increase in manufacturing cost. A semiconductor device is provided which includes a substrate including an embedded insulation film and a semiconductor layer on the embedded insulation film and on which a semiconductor element is formed and a gate electrode on the semiconductor layer, in which the gate electrode includes a band-shaped first electrode portion that extends from a center portion of the semiconductor layer and beyond an end of the semiconductor layer along a first direction in a case where the substrate is viewed from above, and in a cross section in a case where the first electrode portion and the substrate are cut along the first direction, a film thickness of the end of the semiconductor layer is thicker than a film thickness of the center portion of the semiconductor layer.

8 Claims, 32 Drawing Sheets

(51) Int. Cl.
  *H01L 21/84* (2006.01)
  *H01L 23/66* (2006.01)
  *H01L 29/06* (2006.01)
  *H01L 29/423* (2006.01)
  *H01L 29/45* (2006.01)

(52) U.S. Cl.
  CPC .......... *H01L 23/66* (2013.01); *H01L 29/0657* (2013.01); *H01L 29/4238* (2013.01); *H01L 29/45* (2013.01)

(56) References Cited

FOREIGN PATENT DOCUMENTS

| | | |
|---|---|---|
| JP | 2000-216391 | 8/2000 |
| JP | 2005-514770 | 5/2005 |
| JP | 2011-071262 | 4/2011 |

OTHER PUBLICATIONS

International Search Report prepared by the Japan Patent Office dated Mar. 29, 2018, for International Application No. PCT/JP2018/001323.

* cited by examiner

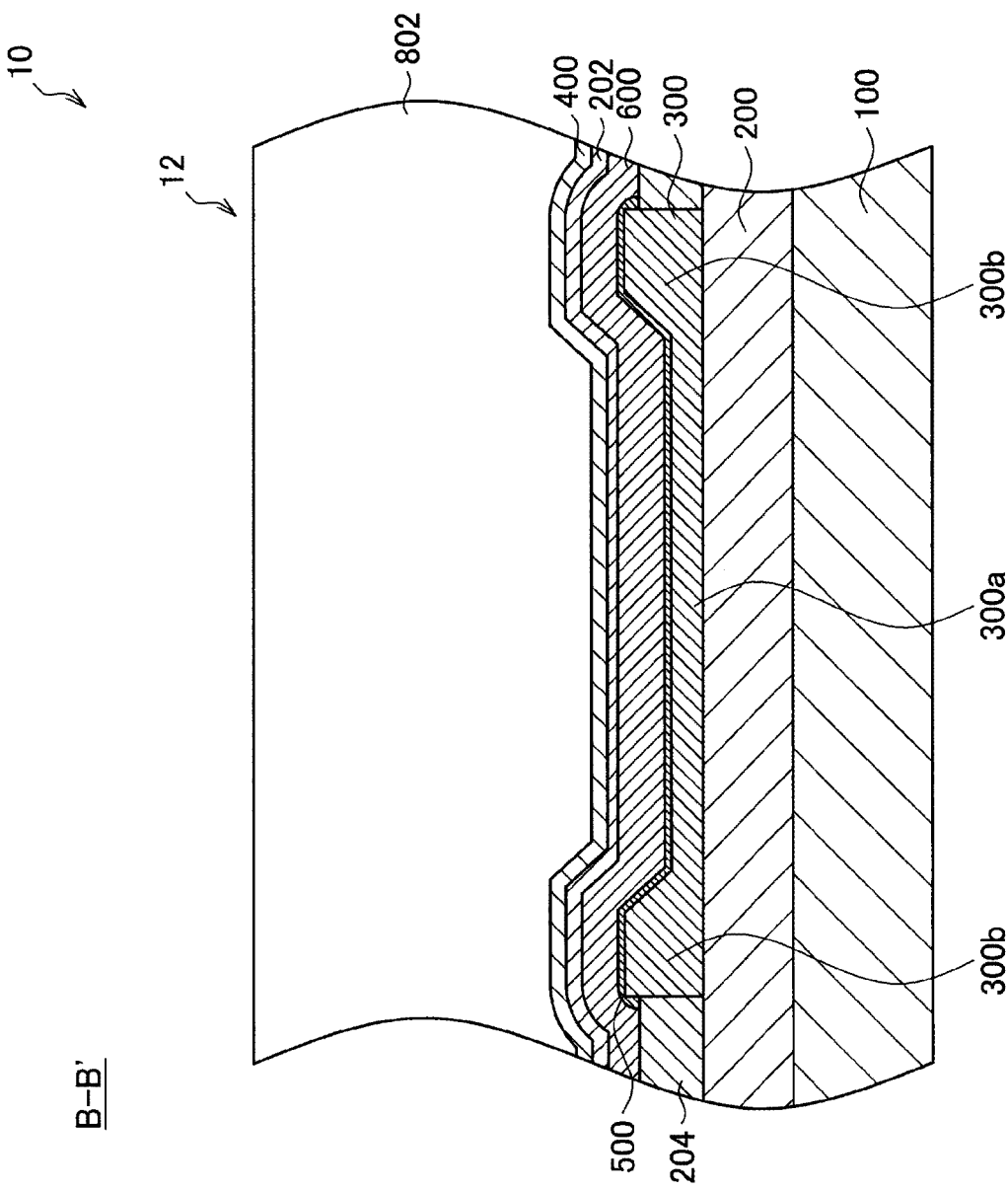

SEMICONDUCTOR DEVICE AND METHOD FOR MANUFACTURING SEMICONDUCTOR DEVICE

CROSS REFERENCE TO RELATED APPLICATIONS

This application is a national stage application under 35 U.S.C. 371 and claims the benefit of PCT Application No. PCT/JP2018/001323 having an international filing date of 18 Jan. 2018, which designated the United States, which PCT application claimed the benefit of Japanese Patent Application No. 2017-043926 filed 8 Mar. 2017, the entire disclosures of each of which are incorporated herein by reference.

TECHNICAL FIELD

The present disclosure relates to a semiconductor device and a method for manufacturing the semiconductor device.

BACKGROUND ART

In a communication device used for wireless communication and the like, a high frequency antenna switch for switching high frequency communication signals is provided. Such a high frequency antenna switch is required to be a device having a small parasitic capacitance of which device characteristics are not deteriorated even when signals to be used have high frequency waves.

Therefore, conventionally, as the antenna switch device, a compound semiconductor such as a GaAs having excellent high frequency characteristics has been used. However, such a compound semiconductor device is expensive, and a device for peripheral circuits for operating the compound semiconductor device is formed on a chip different from the compound semiconductor device. Therefore, it is difficult to suppress manufacturing cost needed when the compound semiconductor device is incorporated into a module and the like.

Therefore, in recent years, an antenna switch integrated circuit (IC) using a silicon on insulator (SOI) circuit in which the antenna switch device and the device for peripheral circuits can be mixedly formed on a single chip has been increasingly developed. The SOI substrate indicates a substrate including an embedded insulation film (BOX layer) provided on a high resistance support substrate and a semiconductor layer (SOI layer) formed of silicon on the embedded insulation film. By using such an SOI substrate, a parasitic capacitance caused by a depletion layer generated in a PN junction region can be reduced. Therefore, it is possible to form the antenna switch device, having device characteristics equivalent to the compound semiconductor, in which high frequency characteristics are less likely to be deteriorated. Moreover, in a case where the antenna switch device is formed by using such an SOI substrate, devices for peripheral circuits can be mixedly formed on the same substrate. Note that, as an example of the device formed on the SOI substrate, a semiconductor device disclosed in Patent Document 1 and the like below can be exemplified.

CITATION LIST

Patent Document

Patent Document 1: Japanese Patent Application Laid-Open No. 2000-216391
Patent Document 2: Japanese Patent Application Laid-Open No. 57-10266

SUMMARY OF THE INVENTION

Problems to be Solved by the Invention

However, there is a case where the SOI layer is partially thinned due to thermal oxidation processing executed in a manufacturing process of a semiconductor device. In the partially thinned portion of the SOI layer, electric field concentration occurs during an operation of a transistor, and this causes deterioration in reliability of the transistor. Furthermore, various measures have been taken so far so as to prevent the deterioration in the reliability of the transistor. However, there has been a case where these measures increase the parasitic capacitance and lower the high frequency characteristics of the transistor and largely increase the manufacturing cost.

Therefore, the present disclosure proposes a semiconductor device capable of reducing a parasitic capacitance, securing high reliability, and suppressing an increase in manufacturing cost.

Solutions to Problems

According to the present disclosure, a semiconductor device is provided which includes a substrate including an embedded insulation film and a semiconductor layer that is provided on the embedded insulation film and on which a semiconductor element is formed and a gate electrode provided on the semiconductor layer, in which the gate electrode includes a band-shaped first electrode portion that extends from a center portion of the semiconductor layer and beyond an end of the semiconductor layer along a first direction in a case where the substrate is viewed from above, and in a cross section in a case where the first electrode portion and the substrate are cut along the first direction, a film thickness of the end of the semiconductor layer is thicker than a film thickness of the center portion of the semiconductor layer.

Furthermore, according to the present disclosure, a method for manufacturing a semiconductor device includes forming a semiconductor layer having a uniform film thickness on a substrate having an embedded insulation film, selectively oxidizing a center portion of the semiconductor layer, and making a film thickness of an end of the semiconductor layer thicker than the film thickness of the center portion.

Effects of the Invention

As described above, according to the present disclosure, it is possible to provide a semiconductor device which can reduce a parasitic capacitance, secure high reliability, and suppress an increase in manufacturing cost.

Note that the above effects are not necessarily limited, and any effect that has been described in the present specification or other effect found from the present specification may be obtained together with or instead of the above effects.

BRIEF DESCRIPTION OF DRAWINGS

FIG. 1C is a cross-sectional diagram taken along a line B-B' of the semiconductor device 10 illustrated in FIG. 1A.

MODE FOR CARRYING OUT THE INVENTION

Figure 1A:
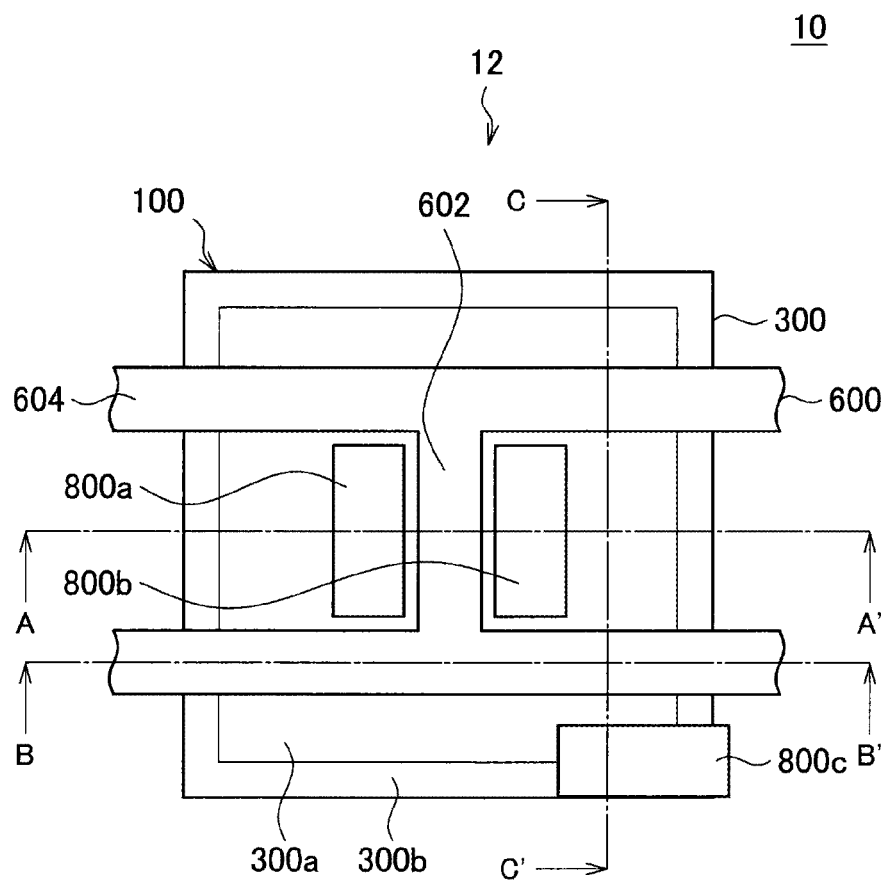
FIG. 1A is a plan view of a semiconductor device 10 according to an embodiment of the present disclosure.

Hereinafter, preferred embodiments of the present disclosure will be described in detail with reference to the accompanying drawings. Note that, in the present specification and the drawings, components having substantially the same functional configuration are denoted with the same reference numeral so as to omit redundant description.

Furthermore, in the present specification and the drawings, there is a case where a plurality of components having substantially the same or similar functional configuration is distinguished from each other by attaching different numerals after the same reference. However, in a case where it is not necessary to particularly distinguish the plurality of components having substantially the same or similar functional configuration from each other, only the same reference numeral is applied. Furthermore, there is a case where components similar to each other in different embodiments are distinguished from each other by adding different alphabets after the same reference numeral. However, in a case where it is not necessary to particularly distinguish the similar components from each other, only the same reference numeral is applied.

Furthermore, the drawings referred in the description below promote description of the embodiment of the present disclosure and understanding of the description, and there is a case where the shape, the dimension, the ratio, and the like illustrated in the drawings are different from actual ones for easy understanding. Moreover, the semiconductor device and the like illustrated in the drawings can be appropriately designed and changed in consideration of the following description and the known techniques. Furthermore, in the description below, the vertical direction in a lamination structure of the semiconductor device and the like corresponds to a relative direction in a case where a surface of the substrate where the semiconductor element is provided is the upper side and may be different from the vertical direction according to an actual gravity acceleration.

Note that the description will be made in the following order.

1. Background when embodiment according to present disclosure is created
2. First embodiment
 2.1. Configuration of semiconductor device 10
 2.2. Method for manufacturing semiconductor device 10
 2.3. Modification
3. Summary
4. Supplement

1. Background when Embodiment According to Present Disclosure is Created

An embodiment according to the present disclosure to be described below relates to an antenna switch IC formed by using an SOI substrate in which an antenna switch device and a device for peripheral circuits can be mixedly mounted on the same chip. However, the embodiment of the present disclosure is not limited to be applied to such a semiconductor device and may be applied to other semiconductor device formed by using the SOI substrate. First, before the description of the embodiment of the present disclosure, background when the present inventors have created the present embodiment will be described.

Figure 25:
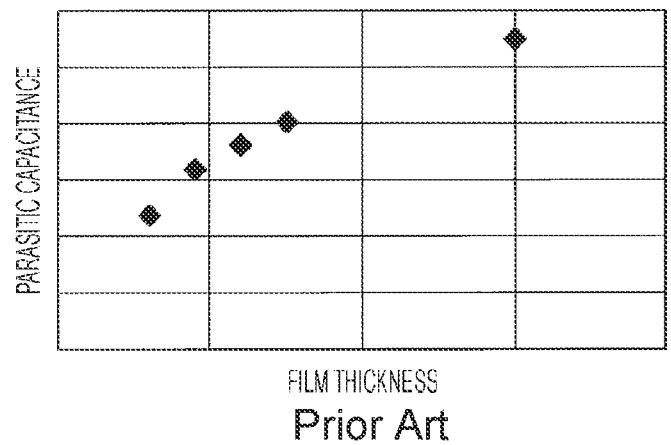
FIG. 25 is a diagram illustrating a relationship of a parasitic capacitance relative to a film thickness of an SOI layer in an SOI substrate.

As described above, the SOI substrate indicates a substrate 100 including an embedded insulation film 200 provided on a high resistance support substrate and a semiconductor layer (referred to as SOI layer below) formed of silicon on the embedded insulation film 200. Since such an SOI substrate can reduce a parasitic capacitance, the SOI substrate is preferable as a substrate used to form an antenna switch device for high frequency signals. Moreover, as it is obvious from FIG. 25 illustrating a relationship of the parasitic capacitance relative to a film thickness of the SOI layer in the SOI substrate, the thinner the SOI substrate is, the smaller the parasitic capacitance can be. Note that, in FIG. 25, the horizontal axis indicates the film thickness of the SOI layer, and the film thickness increases as moving toward the right side in FIG. 25. Furthermore, the vertical axis indicates the parasitic capacitance, and the parasitic capacitance increases as moving upward in FIG. 25. In this way, to thin the SOI layer and reduce the parasitic capacitance reduces an off capacitance of a transistor, and in addition, reduces an insertion loss which is one of important indexes of the high frequency antenna switch device.

However, regarding the SOI substrate having a thin SOI layer, for example, having the film thickness of the SOI layer equal to or less than 100 nm, there is a case where the SOI layer is partially thinned due to thermal oxidation processing executed in a manufacturing process. Hereinafter, with reference to FIG. 26A which is a schematic diagram of an A-A' cross section of a semiconductor device 90 and FIG. 26B which is a schematic diagram of a B-B' cross section of the semiconductor device 90, a partially thinned SOI layer (diffusion layer) 300 will be described. Note that, a transistor 92 provided on the semiconductor device 90 is assumed as an n-type metal-oxide-semiconductor field-effect-transistor (MOS-FET) similar to a transistor 12 according to an embodiment of the present disclosure, and it is assumed that the transistor 92 have an H-shaped gate electrode structure in a planar structure. Therefore, in a case where the plan view of the semiconductor device 90 is illustrated as the semiconductor device having an H-shaped gate electrode 600 lying down on its side, the cross section illustrated in FIG. 26A corresponds to a cross section obtained by cutting the center of the H-shaped gate electrode 600 lying down on its side along a horizontal direction in the plan view. Moreover, furthermore, the cross section illustrated in FIG. 26B corresponds to a cross section in a case where the semiconductor device is cut along the gate electrode 600 extending in the horizontal direction in the plan view.

Figure 26A:
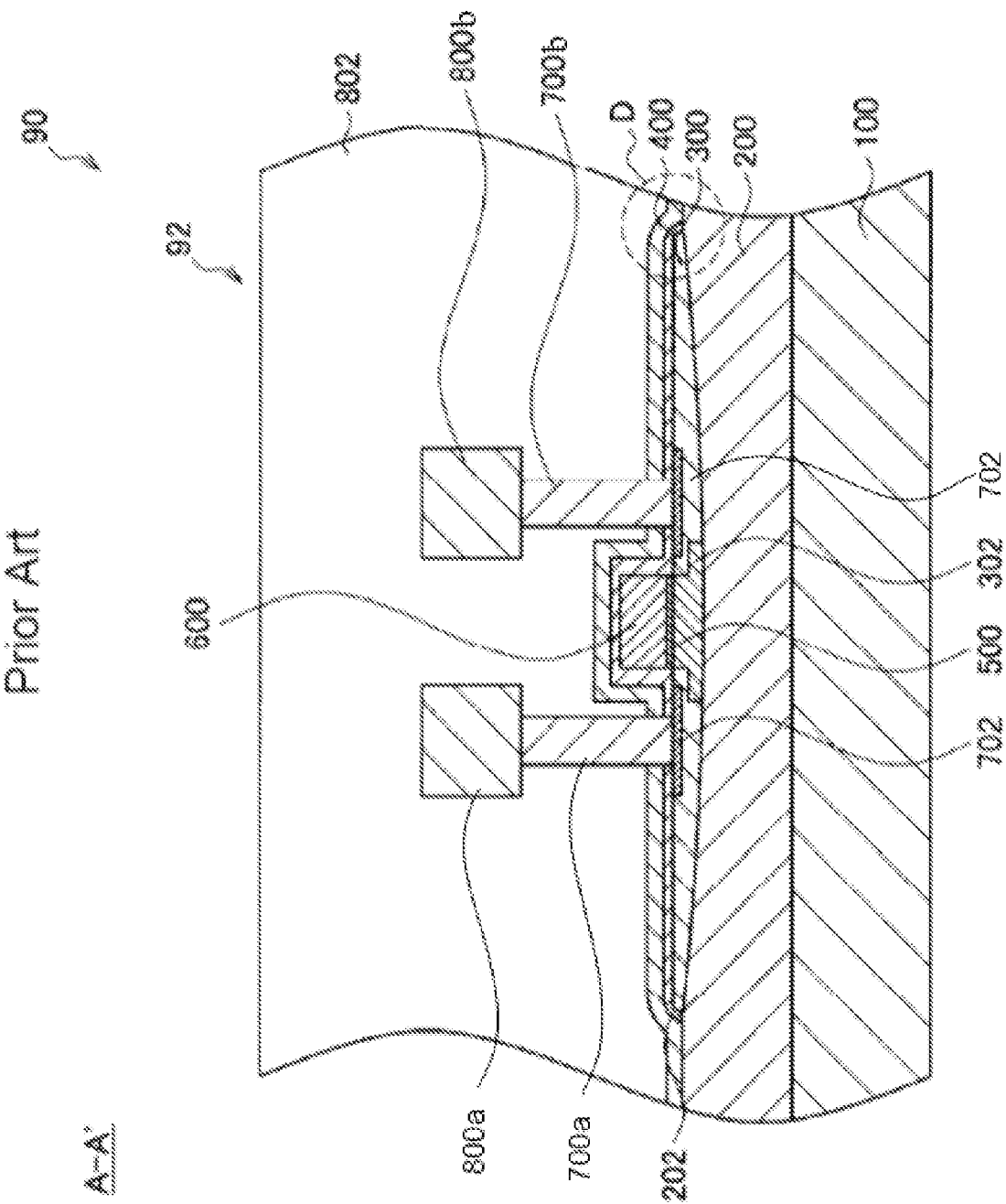
FIG. 26A is a schematic diagram of an A-A' cross section of a semiconductor device 90 according to a comparative example.
Figure 26B:
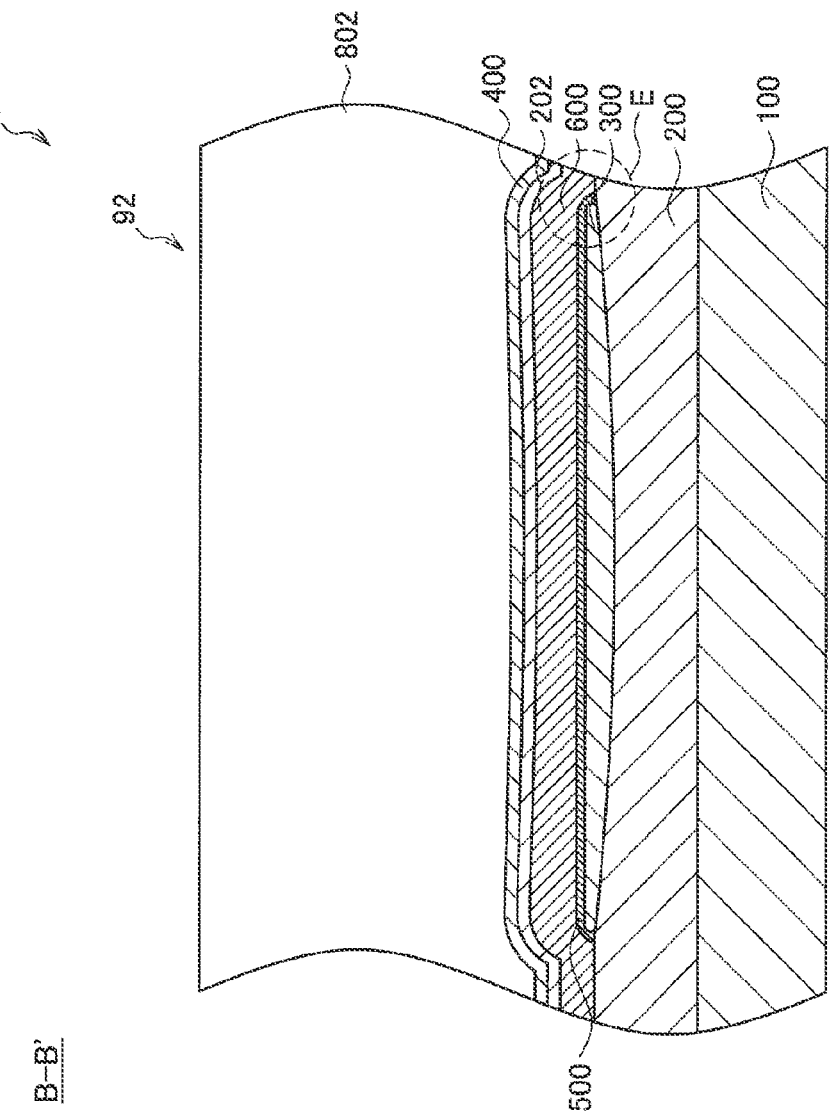
FIG. 26B is a schematic diagram of a B-B' cross section of the semiconductor device 90 according to the comparative example.

As illustrated in FIG. 26A, on an upper surface of the diffusion layer 300 positioned on both sides of the gate region 302, two silicide films 702 are provided apart from the gate region 302. Moreover, on the respective silicide films 702, a source contact via 700a and a source electrode 800a, and a drain contact via 700b and a drain electrode 800b are provided. Furthermore, an insulation film 202 formed of a silicon oxide film is provided so as to cover the gate electrode 600 and the diffusion layer 300. Moreover, an insulation film 400 is further provided so as to cover the insulation film 202. In addition, an insulation film 802 formed of a silicon oxide film is provided on the insulation film 400, between the contact vias 700, and between the source electrode 800a and the drain electrode 800b. As illustrated in FIGS. 26A and 26B, ends of the SOI layer 300 are thin. More specifically, the end of the SOI layer 300 circled by a circle D in FIG. 26A and the end of the SOI layer 300 circled by a circle E in FIG. 26B are thinner than other portions of the SOI layer 300, and each end has a pointed shape. This is considered that, a shallow trench isolation (STI)(not illustrated) for separating the SOI layer 300 relative to the support substrate 100 on which the SOI layer 300 is provided is formed at the time of manufacturing the semiconductor device, and the end of the SOI layer 300 is thinned due to the thermal oxidation processing executed at this time. Moreover, since the thermal oxidation processing is executed when a gate insulation film 500 is formed, it is considered that the end of the SOI layer 300 is thinned due to this thermal oxidation processing. In the thermal oxidation processing, an upper layer portion of the SOI layer 300 is oxidized, and in addition, a lower layer portion of the SOL layer 300 is oxidized since oxygen flows under the SOI layer 300. Therefore, the end of the SOI layer 300 is thinned and has a pointed shape.

In this way, at the end where the SOI layer 300 is partially thinned and has a pointed shape, electric field concentration is likely to occur during an operation of the transistor. Specifically, as indicated in the region surrounded by the circle E in FIG. 26B, in a portion where the gate electrode 600 overlaps with the end of the SOI layer 300, the electric field concentration is likely to occur. As a result, a breakdown of the gate insulation film 500 at a position where the electric field concentration occurs is likely to occur, and reliability of the gate insulation film 500, in other words, reliability of the semiconductor device 90 is deteriorated.

Therefore, to prevent the deterioration in the reliability, it is considered to control an oxidation amount to be small in the thermal oxidation processing, for example, at the time when the gate insulation film 500 is formed. However, in this way, it possible to prevent the end of the SOI layer 300 from being thinned. However, the degree of freedom in device design such as the film thickness of the gate insulation film 500 is restricted.

Therefore, as in Patent Document 2, it is considered to form a sufficiently thick film thickness of the source region/ drain region positioned at the ends of the SOI layer 300 with the gate therebetween (Raised Source Drain structure). However, according to this method, since the end of the SOI layer 300 is not thinned, the reliability is not deteriorated. However, the parasitic capacitances between the source and the gate and between the drain and the gate increase, and the high frequency characteristics are deteriorated. In addition, with this method, when the thick film portion of the SOI layer 300 is formed, selective epitaxial growth is used. Therefore, manufacturing cost is increased, and in addition, time required for manufacture is increased.

Furthermore, in Patent Document 1, the source region/ drain regions are formed in the thick film portions positioned at the ends of the SOI layer with the gate therebetween, and the STI for separating the SOI layer is thickened, and accordingly, the breakdown at the end of the SOI layer is prevented. In Patent Document 1, since a drain contact and a source contact are provided on the thick film portions of the SOI layer, it is necessary to pattern the contacts on the thick film portions with high accuracy. Therefore, since the patterning with high accuracy is required, manufacturing yield is deteriorated. Furthermore, by increasing a layout size of the transistor, the patterning with high accuracy is not required. However, since the layout size is increased, this increases the manufacturing cost of the semiconductor device. In particular, since the layout size of the transistor having a plurality of gates tends to be larger, the manufacturing cost is largely increased.

In such a situation, the present inventors have made intensive studies to obtain a semiconductor device which can reduce the parasitic capacitance, secure the high reliability, and suppress the increase in the manufacturing cost. Then, the present inventors have created the embodiment of the present disclosure to be described below. Specifically, according to the present disclosure, it is possible to provide a semiconductor device which can reduce a parasitic capacitance, secure high reliability, and suppress an increase in manufacturing cost. Hereinafter, the embodiment of the present disclosure created by the present inventors will be described in detail.

2. First Embodiment

2.1. Configuration of Semiconductor Device 10

(Planar Configuration)

First, a planar configuration of a semiconductor device 10 according to an embodiment of the present disclosure will be described with reference to FIG. 1A. FIG. 1A is a plan view of the semiconductor device 10 according to the embodiment of the present disclosure. Note that, in FIG. 1A, illustration of an insulation film 202, an insulation film 400, an insulation film 802, and an STI 204 is omitted for easy understanding. Furthermore, in the present embodiment described below, it is assumed that a transistor 12 be an n-type MOS-FET and have an H-shaped gate electrode structure in the planar structure. However, the transistor 12 according to the present embodiment is not limited to such an example and may be a transistor having other configuration.

In the semiconductor device 10 according to the present embodiment, as illustrated in the plan view in FIG. 1A, an embedded insulation film 200 (refer to FIGS. 1B to 1D) is provided on a silicon support substrate 100 which is a high-resistance silicon having a resistivity equal to or higher than 500 Ωcm, and in addition, a diffusion layer (semiconductor layer) 300 is provided on the embedded insulation film 200. The diffusion layer 300 includes a thin film portion 300a and thick film portions 300b.

On the diffusion layer 300, the transistor 12 is provided. Specifically, as illustrated in FIG. 1A, on the diffusion layer 300, a gate electrode 600, a source electrode 800a, a drain electrode 800b, and a body contact electrode 800c are provided. The gate electrode 600 provided on the diffusion layer 300 is formed of polysilicon and has an H-like shape lying down on its side as viewed from above the support substrate 100. Specifically, the H-shaped gate electrode 600 has a rectangular electrode portion (second electrode portion) 602 which is positioned at the center in FIG. 1A and extends along a vertical direction (second direction) in FIG. 1A. Moreover, the gate electrode 600 includes two band-shaped wiring portions (first electrode portion) 604 which sandwich the rectangular electrode portion 602 in the center portion from the upper and lower sides in FIG. 1A and extend in a horizontal direction (first direction) in FIG. 1. Furthermore, the two wiring portions 604 connect to the electrode portion 602 at the center of the electrode portion 602.

Moreover, as illustrated in FIG. 1A, in the present embodiment, the wiring portion 604 of the gate electrode 600 extends along the horizontal direction in FIG. 1A on the diffusion layer 300 and from the center portion of the diffusion layer 300 and further extends along the horizontal direction in FIG. 1A beyond the end of the diffusion layer 300.

Furthermore, the source electrode 800a and the drain electrode 800b formed of metal films are provided so as to sandwich the electrode portion 602 of the gate electrode 600 positioned at the center of the diffusion layer 300 from the left and right sides. The source electrode 800a and the drain electrode 800b function as wirings respectively connected to a source region and a drain region of the transistor 12.

Then, the diffusion layer 300 is formed of a silicon layer to which desired impurities are implanted. Specifically, n-type impurities such as phosphorus and arsenic are diffused below and around the source electrode 800a and the drain electrode 800b of the diffusion layer 300, and p-type impurities such as boron are diffused in other region of the diffusion layer 300.

Furthermore, as illustrated in the lower right portion of FIG. 1A, the body contact electrode 800c is provided in a lower right portion of the diffusion layer 300. The body contact electrode 800c is used as wiring for fixing and controlling a potential of the diffusion layer 300 so as to suppress a substrate floating effect.

Furthermore, the STI 204 in which an insulation film such as a silicon oxide film is embedded (refer to FIGS. 1B to 1D) is provided so as to surround the diffusion layer 300 and separates the transistor 12 provided on the diffusion layer 300 from other elements provided on the support substrate 100. Moreover, it is possible to generate a tensile stress in a channel of the transistor 12 by embedding a film having a tensile stress in the STI 204.

(Cross-Sectional Configuration)

Figure 1B:
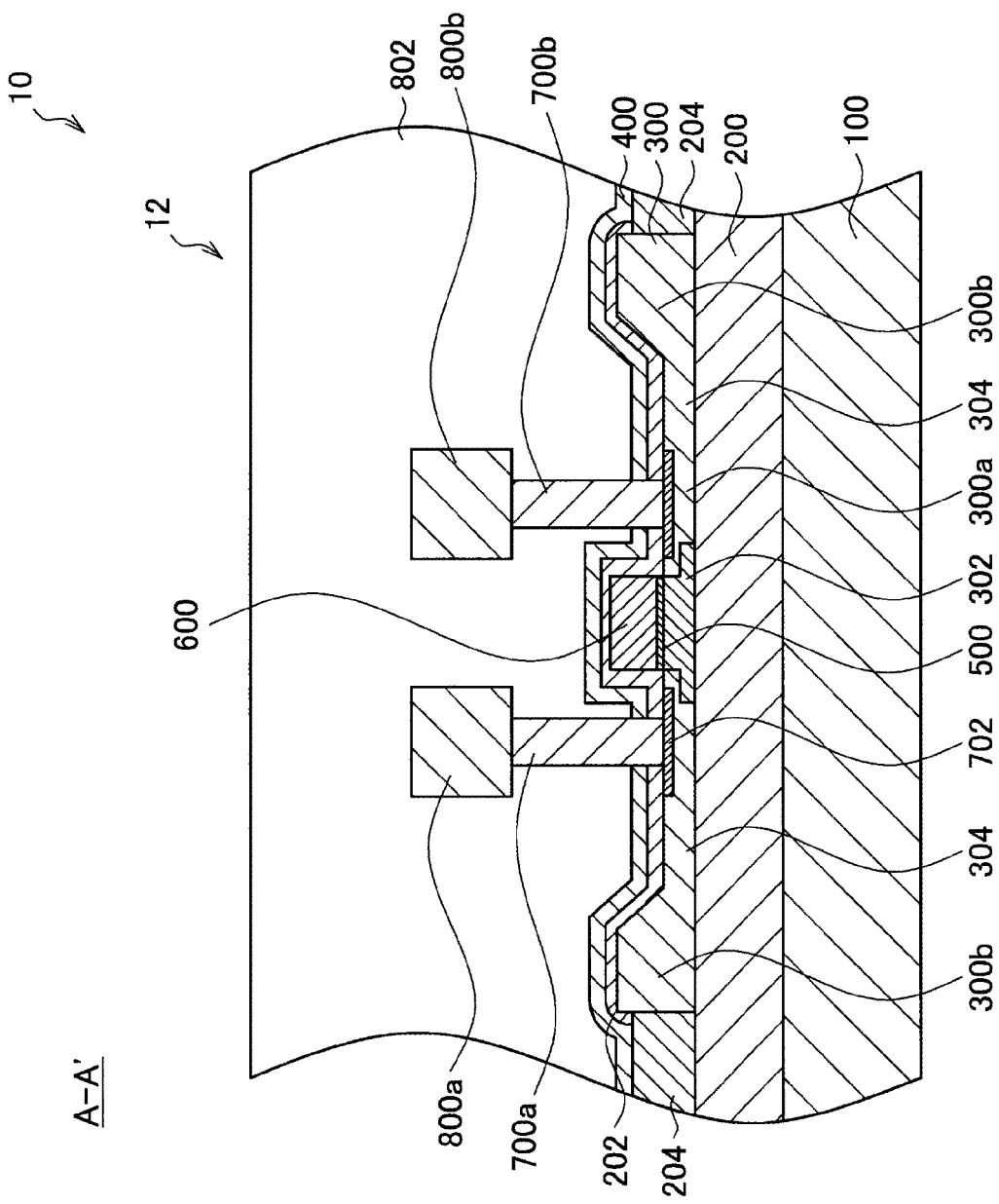
FIG. 1B is a cross-sectional diagram taken along a line A-A' of the semiconductor device 10 illustrated in FIG. 1A.
Figure 1D:
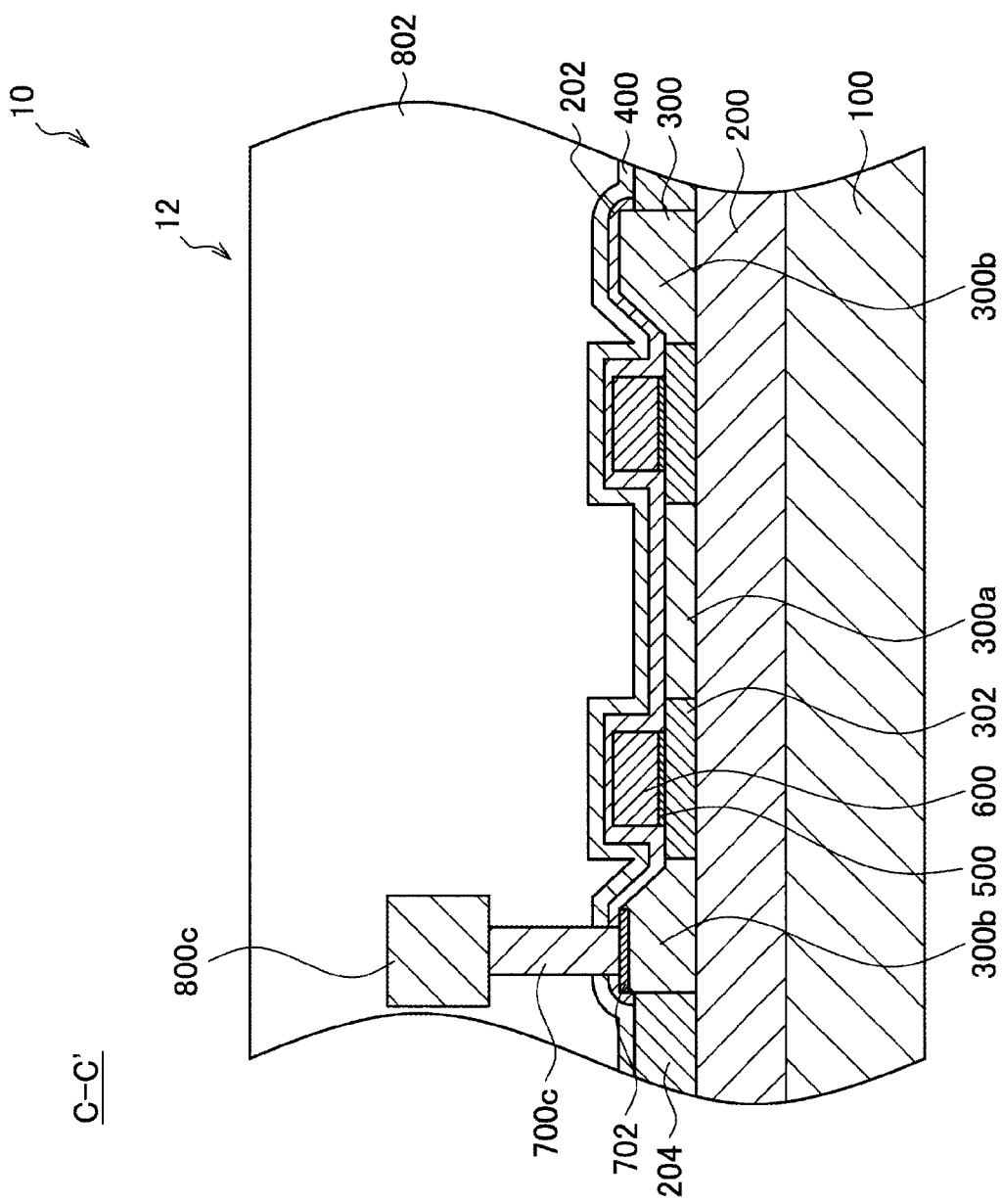
FIG. 1D is a cross-sectional diagram taken along a line C-C' of the semiconductor device 10 illustrated in FIG. 1A.

Next, a cross-sectional configuration of the semiconductor device 10 according to the present embodiment will be described with reference to FIGS. 1B to 1D. FIG. 1B is a cross-sectional diagram taken along a line A-A' of the semiconductor device 10 illustrated in FIG. 1A, FIG. 1C is a cross-sectional diagram taken along a line B-B' of the semiconductor device 10 illustrated in FIG. 1A, and in addition, FIG. 1D is a cross-sectional diagram taken along a line C-C' of the semiconductor device 10 illustrated in FIG. 1A.

As illustrated in FIG. 1B which illustrates a cross section of the semiconductor device 10 cut along the line A-A' in FIG. 1A, the semiconductor device 10 according to the present embodiment includes the embedded insulation film 200 formed of a silicon oxide film provided on the support substrate 100 formed of high-resistance silicon as described above. Moreover, the semiconductor device 10 includes the diffusion layer 300 formed of a silicon layer provided on the embedded insulation film 200. In other words, in the present embodiment, the SOI substrate is used as a substrate, and the diffusion layer 300 corresponds to the SOI layer. In the present embodiment, by using the SOI substrate, the parasitic capacitance of the transistor 12 can be reduced. Note that the support substrate 100 may be thinned by grinding a rear surface after the semiconductor device 10 is manufactured, and a film thickness of the support substrate 100 is not particularly limited. Furthermore, the embedded insulation film 200 has a thickness of about 100 nm to 2000 nm, and preferably has a film thickness of about 400 nm in consideration of high frequency characteristics of the transistor 12.

As illustrated in FIG. 1B, the diffusion layer 300 includes a thin film portion 300a having a thin film thickness in a center portion and thick film portions 300b having a film thickness thicker than the thin film portion 300a at the ends. The center portion of the thin film portion 300a positioned below the gate electrode 600 corresponds to a gate region 302 of the transistor 12 in which p-type impurities are diffused. Furthermore, a region of the thin film portion 300a which sandwiches the gate region 302 from the left and right sides in FIG. 1B corresponds to a source region and a drain region 304 in which n-type impurities are diffused. Note that an impurity concentration of the source region and the drain region 304 adjacent to the gate region 302 is preferably lower than an impurity concentration of the source region and the drain region 304 positioned apart from the gate region 302.

Furthermore, the thick film portion 300b positioned at the end of the diffusion layer 300 is thicker than the thin film portion 300a positioned in the center portion of the diffusion layer 300, and specifically, the thick film portion 300b has a film thickness twice to ten times of the film thickness of the thin film portion 300a. More specifically, in consideration of achievement of both the high frequency characteristics and reliability of the transistor 12, the film thickness of the thick film portion 300b is preferably 140 nm to 200 nm, and the film thickness of the thin film portion 300a is preferably 20 nm to 70 nm.

Note that, in the plan view in FIG. 1A described above, the thin film portion positioned in the center portion of the diffusion layer 300 is indicated as 300a, and the thick film portion positioned at the end of the diffusion layer 300 is indicated as 300b.

Moreover, in the semiconductor device 10 according to the present embodiment, the gate insulation film 500 is provided on the gate region 302 provided in the center portion of the diffusion layer 300. The gate insulation film 500 is formed of a silicon oxide film, and the film thickness of the gate insulation film 500 can be arbitrarily selected.

Furthermore, on the upper surface of the diffusion layer 300 positioned on both sides of the gate region 302, two silicide films 702 are provided apart from the gate region 302. Moreover, on the respective silicide films 702, a source contact via 700a and the source electrode 800a, and a drain contact via 700b and the drain electrode 800b are provided. In other words, the contact vias 700a and 700b corresponding to the source and the drain are provided on the thin film portion 300a of the diffusion layer 300 so as to sandwich the electrode portion 602 of the gate electrode 600. By providing the source/drain contact vias 700a and 700b on the thin film portion 300a, the parasitic capacitance between the source and the drain can be reduced. Note that the silicide film 702 is a compound film of silicon and other element, and each of the contact vias 700a and 700b, the source electrode 800a, and the drain electrode 800b is formed of a metal film and the like. Note that, in the present embodiment, the film thickness, the size, the shape, and the like of each of the silicide film 702, the contact vias 700a and 700b, and the source/drain electrodes 800a and 800b are not particularly limited. Furthermore, in the present embodiment, to keep high manufacturing yield of the semiconductor device 10, it is preferable to lay out the transistor 12 in consideration of manufacturing variations and the like.

Note that, in the above description, to reduce the parasitic capacitance between the source and the drain, the source/drain contact vias 700a and 700b are provided on the thin film portion 300a of the diffusion layer 300. However, the present embodiment is not limited to this, and in a case where it is not necessary to reduce the parasitic capacitance, the source/drain contact vias 700a and 700b may be provided on the thick film portion 300b of the diffusion layer 300.

Furthermore, the STI (separation insulation film) 204 is provided around the diffusion layer 300 so as to separate the transistor 12 from other elements. Specifically, the STI 204 includes a trench provided to surround the diffusion layer 300 and a silicon oxide film embedded in the trench. Note that, in the present embodiment, the width, the depth, the shape, and the like of the trench of the STI 204 are not particularly limited.

Furthermore, the insulation film 202 formed of a silicon oxide film is provided so as to cover the gate electrode 600, the diffusion layer 300, and the STI 204. Moreover, the insulation film 400 is further provided so as to cover the insulation film 202. In addition, the insulation film 802 formed of a silicon oxide film is provided on the insulation film 400, between the contact vias 700, and between the source electrode 800a and the drain electrode 800b. Note that, in the present embodiment, the material, the film thickness, and the like of the insulation film 202, and insulation films 400 and 802 are not particularly limited.

Next, the semiconductor device 10 according to the present embodiment will be described with reference to FIG. 1C which is a cross-sectional diagram cut along the gate electrode 600 extending in the horizontal direction in FIG. 1A, in other words, a cross-sectional diagram cut along the line B-B' in FIG. 1A. As described above, in the cross-sectional diagram, the semiconductor device 10 includes the support substrate 100, the embedded insulation film 200 provided on the support substrate 100, and the diffusion layer 300 provided on the embedded insulation film.

As in the cross section in FIG. 1B, in the cross section in FIG. 1C, the diffusion layer 300 includes the thin film portion 300a having the thin film thickness in the center portion and the thick film portion 300b having the thick film thickness at both ends. Specifically, in this cross section, the thick film portion 300b has a film thickness twice to ten times of the film thickness of the thin film portion 300a, and more specifically, the film thickness of the thick film portion 300b is preferably 140 nm to 200 nm, and the film thickness of the thin film portion 300a is preferably 20 nm to 70 nm.

Furthermore, in the cross section in FIG. 1C, the gate electrode 600 is provided on the thin film portion 300a and the thick film portion 300b of the diffusion layer 300 via the gate insulation film 500. As illustrated in FIG. 1C, the gate electrode 600 extends in the horizontal direction in FIG. 1C on the diffusion layer 300 and further extends in the horizontal direction in FIG. 1C beyond the ends of the diffusion layer 300. In other words, the gate electrode 600 is provided so as to extend not only beyond the thin film portion 300a of the diffusion layer 300 but also beyond the thick film portion 300b.

By the way, in the comparative example described above, since the film thickness of the diffusion layer 300 is thin at the end of the diffusion layer 300 where the gate electrode 600 and the diffusion layer 300 overlap with each other, at the time when the transistor 92 is operated, electric field concentration is likely to occur at the end of the diffusion layer 300 having the thin film thickness. As a result, a breakdown of the gate insulation film 500 at a position where the electric field concentration occurs is likely to occur, and the reliability of the gate insulation film 500, in other words, the reliability of the semiconductor device 90 has been deteriorated. On the other hand, as illustrated in FIG. 1C, in the semiconductor device 10 according to the present embodiment, the film thickness of the end (thick film portion 300b) of the diffusion layer 300 where the gate electrode 600 and the diffusion layer 300 overlap with each other is thick. As a result, even in a case where the thermal oxidation processing is executed in the manufacturing process, the film thickness of the end of the diffusion layer 300 is not thinned. Therefore, according to the present embodiment, since the film thickness of the thick film portion 300b which is the end of the diffusion layer 300 is not thinned, the electric field concentration is unlikely to occur at the end of the diffusion layer 300 when the transistor 12 is operated, and the breakdown of the gate insulation film 500 is unlikely to occur. In other words, according to the present embodiment, the semiconductor device 10 can maintain high reliability.

Next, the semiconductor device 10 according to the present embodiment will be described with reference to FIG. 1D which is a cross-sectional diagram cut along the line C-C' extending in the vertical direction in FIG. 1A. The cross section is a cross section obtained in a case where the semiconductor device 10 is cut across the body contact electrode 800c. As described above, in the cross-sectional diagram, the semiconductor device 10 includes the support substrate 100, the embedded insulation film 200 provided on the support substrate 100, and the diffusion layer 300 provided on the embedded insulation film.

As in the cross section in FIG. 1B, in the cross section in FIG. 1D, the diffusion layer 300 includes the thin film portion 300a having the thin film thickness in the center portion and the thick film portion 300b having the thick film thickness at both ends. Specifically, in this cross section, the thick film portion 300b has a film thickness twice to ten times of the film thickness of the thin film portion 300a, and more specifically, the film thickness of the thick film portion 300b is preferably 140 nm to 200 nm, and the film thickness of the thin film portion 300a is preferably 20 nm to 70 nm.

Furthermore, in the cross section in FIG. 1D, the gate electrode 600 is provided on the thin film portion 300a of the diffusion layer 300 via the gate insulation film 500.

Moreover, as illustrated on the light side in FIG. 1D, a body contact via 700c and the body contact electrode 800c are provided on the upper surface of the thick film portion 300b via the silicide film 702. Note that, as described above, the silicide film 702 is a compound film of silicon and other element, and the contact via 700c and the body contact electrode 800c are formed of metal films and the like. Furthermore, in the present embodiment, the film thickness, the size, the shape, and the like of each of the silicide film 702, the body contact via 700c, and the body contact electrode 800c are not particularly limited.

As described above, the source/drain contact vias 700a and 700b are provided on the thin film portion 300a of the diffusion layer 300, and in this way, the parasitic capacitance between the source and the drain is reduced. On the other hand, the body contact via 700c is provided on the thick film portion 300b of the diffusion layer 300. Since the effect of the parasitic capacitance between a body (diffusion layer 300) and the gate on the high frequency characteristics of the transistor 12 is small, the body contact via 700c may be provided on the thick film portion 300b of the diffusion layer 300.

As described above, in the present embodiment, the diffusion layer 300 is formed so that the film thickness of the thick film portion 300b at the end of the diffusion layer 300 is thick. As a result, even in a case where the thermal oxidation processing is executed in the manufacturing process, the film thickness of the end of the diffusion layer 300 is not thinned. Therefore, according to the present embodiment, since the film thickness of the thick film portion 300b which is the end of the diffusion layer 300 is not thinned, the electric field concentration is unlikely to occur at the end of the diffusion layer 300 when the transistor 12 is operated, and the breakdown of the gate insulation film 500 is unlikely to occur. In other words, according to the present embodiment, the semiconductor device 10 can maintain high reliability.

Moreover, by forming the thick film portion 300b in the diffusion layer 300, a surface area of the diffusion layer 300 increases, and heat is easily dissipated from the diffusion layer 300. Therefore, a temperature in a channel region of the transistor 12 is lowered. In other words, by forming the thick film portion 300b in the diffusion layer 300, a thermal resistance of the transistor 12 can be reduced. Furthermore, since a heat capacity of the diffusion layer 300 increases by forming the thick film portion 300b in the diffusion layer 300, the transistor 12 is less likely to cause an electrostatic breakdown caused by an instantaneous surge.

Furthermore, since the film thickness of the thick film portion 300b of the diffusion layer 300 is thick, the resistance is lowered, and the thick film portion 300b operates as an inductor component relative to high frequencies. Moreover, since the inductor component has a floating capacity caused by the embedded insulation film 200 positioned below the diffusion layer 300, the inductor component and the floating capacity form a resonant circuit. The resonant circuit can function as a high frequency filter having a desired frequency.

Moreover, by forming the thick film portion 300b in the diffusion layer 300, warpage of the diffusion layer 300 is reduced, and a compression stress applied to the channel region of the transistor 12 can be relaxed. As a result, deterioration in electron mobility in the channel region can be prevented, and deterioration in insertion loss of an antenna switch can be prevented.

As described above, since the semiconductor device 10 according to the present embodiment can reduce the parasitic capacitance and secure high reliability, the semiconductor device 10 can be applied to, for example, a high frequency antenna switch IC (high frequency antenna device) or an IC which mounts a high frequency antenna switch device.

Note that, in the present embodiment, it is sufficient if the thick film portion 300b having the thick film thickness is provided at least at the end of the diffusion layer 300 overlapped with the gate electrode 600 in the B-B' cross section illustrated in FIG. 1C. In particular, at the end described above, a region where the gate electrode 600 and the diffusion layer 300 overlap with each other is wide, and a breakdown of the gate insulation film 500 easily occurs due to the electric field concentration in a case where the film thickness of the end is thinned. Therefore, it is preferable to provide the thick film portion 300b at least at the end.

Figure 2:
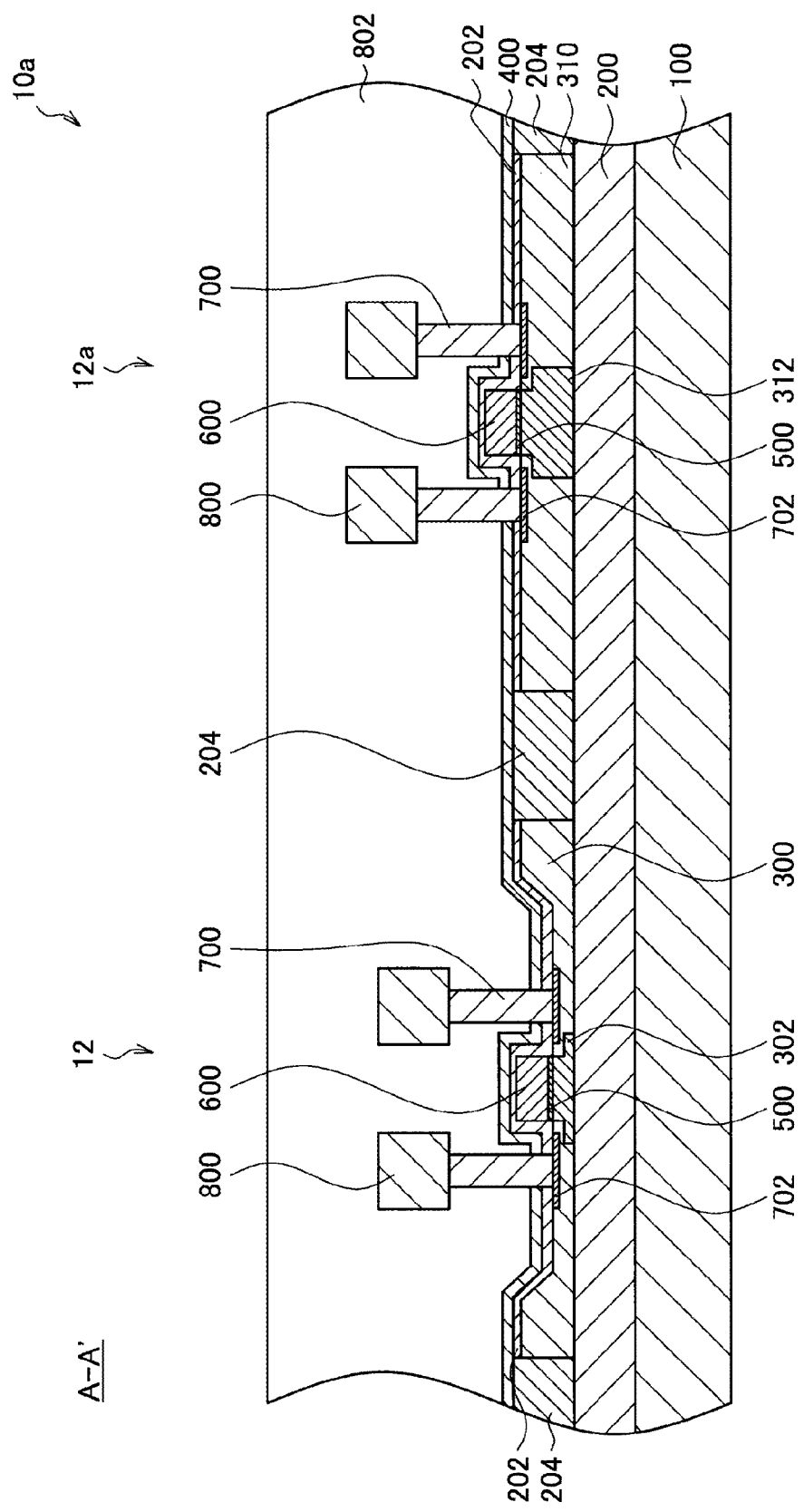
FIG. 2 is a cross-sectional diagram of a semiconductor device 10a according to a modification of the embodiment of the present disclosure.

Furthermore, the semiconductor device 10 according to the present embodiment may include other transistor 12a, of which at least a film thickness of the gate region 302 is different from that of the transistor 12, on the same support substrate 100. A semiconductor device 10a having the other transistor 12a will be described with reference to FIG. 2. FIG. 2 is a cross-sectional diagram of the semiconductor device 10a according to a modification of the present embodiment, and specifically, is a cross-sectional diagram of a cross section corresponding to FIG. 1B.

As illustrated in FIG. 2, the semiconductor device 10a according to the modification includes the other transistor 12a of which the film thickness of the gate region 302 (312) is different from that of the transistor 12. The transistor 12a basically has the structure similar to the transistor 12. However, the film thickness of the gate region 312 of the transistor 12a is thicker than the gate region 302 of the transistor 12. More specifically, to suppress the substrate floating effect, the film thickness of the gate region 312 of the transistor 12a is preferably thicker, and specifically, is preferably 140 nm to 200 nm. Moreover, a diffusion layer 310 on which the transistor 12a is formed is different from the diffusion layer 300 of the transistor 12 and may have a form which does not have the thin film portion 300a and the thick film portion 300b and has a uniform film thickness. In this case, since the diffusion layer 310 is thicker than the thin film portion 300a of the diffusion layer 300, the diffusion layer 300 is not thinned due to the thermal oxidation processing and the like. Therefore, since the transistor 12a can avoid the electric field concentration described above, the transistor 12a has high reliability. Note that, for example, the transistor 12a can be used as a device for peripheral circuits for which it is not necessary to consider the high frequency characteristics. In other words, in the present embodiment, since devices for peripheral circuits can be mixedly formed on the same support substrate 100, the increase in the manufacturing cost can be suppressed.

2.2. Method for Manufacturing Semiconductor Device 10

Next, a method for manufacturing the semiconductor device 10 according to the embodiment of the present disclosure illustrated in FIGS. 1A to 1D will be described with reference to FIGS. 3 to 17. FIGS. 3 to 17 are cross-sectional diagrams for explaining processes in the method for manufacturing the semiconductor device according to the embodiment of the present disclosure, and specifically, correspond to the cross-sectional diagram illustrated in FIG. 1B.

Figure 3:
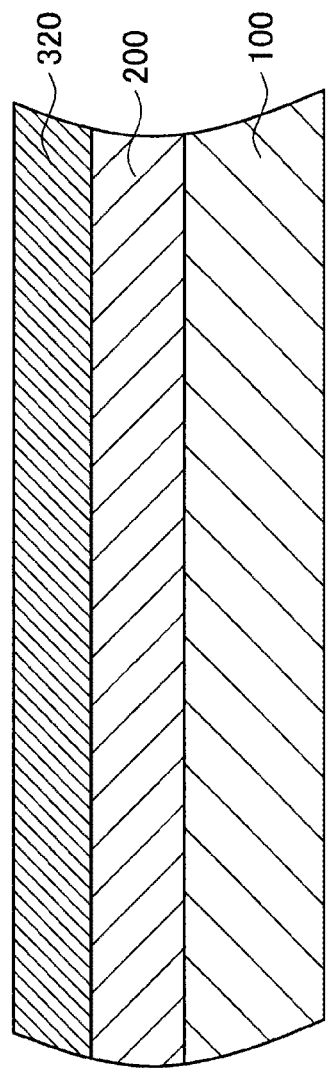
FIG. 3 is a cross-sectional diagram (No. 1) for explaining each process in a method for manufacturing a semiconductor device according to an embodiment of the present disclosure.

First, in the manufacturing method according to the present embodiment, as illustrated in FIG. 3, the embedded insulation film 200, of which the film thickness is preferably 100 nm to 2000 nm, preferably 400 nm, formed of a silicon oxide film is formed on the support substrate 100. Moreover, a silicon layer 320 of which a film thickness is 30 nm to 400 nm, preferably 175 nm is formed on the embedded insulation film 200. In this way, an SOI substrate including the support substrate 100, the embedded insulation film 200, and the silicon layer 320 can be obtained. Note that a method for forming the embedded insulation film 200 and the silicon layer 320 is not particularly limited, and various known film forming methods can be used.

Figure 4:
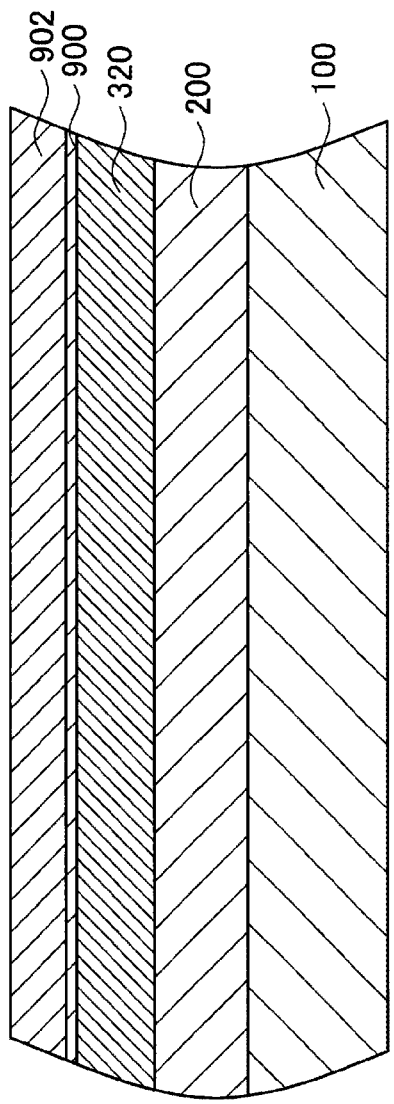
FIG. 4 is a cross-sectional diagram (No. 2) for explaining each process in the method for manufacturing the semiconductor device according to the embodiment of the present disclosure.

Next, as illustrated in FIG. 4, by executing oxidation processing on the upper surface of the silicon layer 320, a silicon oxide film 900 of which a film thickness is 10 nm to 100 nm, preferably 10 nm is formed. Note that a method of the oxidation processing is not particularly limited, and various known oxidation processing methods can be used. Moreover, a silicon nitride film 902 of which a film thickness is 10 nm to 300 nm, preferably 100 nm is formed on the silicon oxide film 900 by chemical vapor deposition (CVD).

Figure 5:
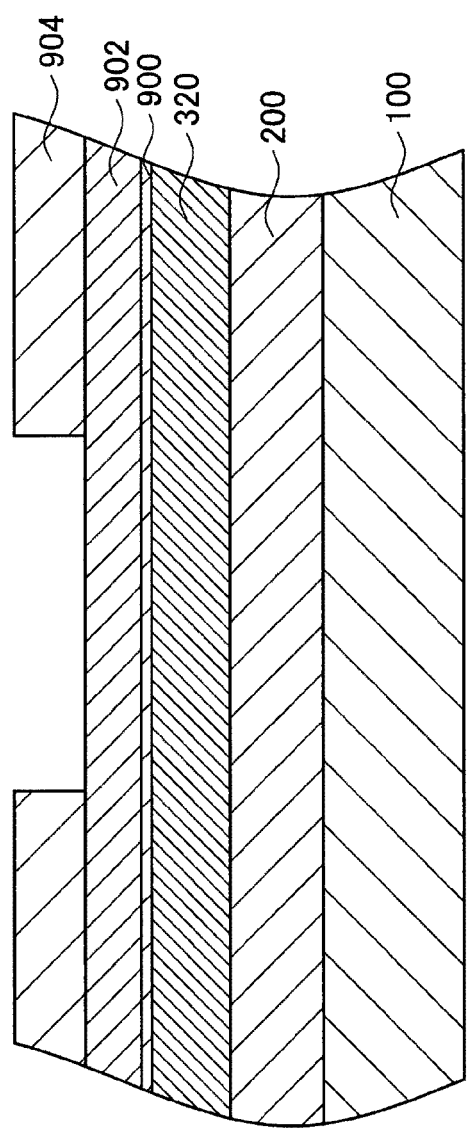
FIG. 5 is a cross-sectional diagram (No. 3) for explaining each process in the method for manufacturing the semiconductor device according to the embodiment of the present disclosure.

Then, as illustrated in FIG. 5, the entire surface of the silicon nitride film 902 is coated with a resist and exposed by using photolithography so as to form a resist pattern 904. The resist pattern 904 has a pattern having an opening at a position where the film thickness of the silicon layer 320 is thin. The pattern is preferably a layer pattern with consideration in which a length of a region between the thin film portion (corresponding to thin film portion 300a described above) and the thick film portion (corresponding to thick film portion 300b described above) of the silicon layer 320 where the film thickness gradually changes, in other words, a distance between the thin film portion and the thick film portion is about 400 nm.

Figure 6:
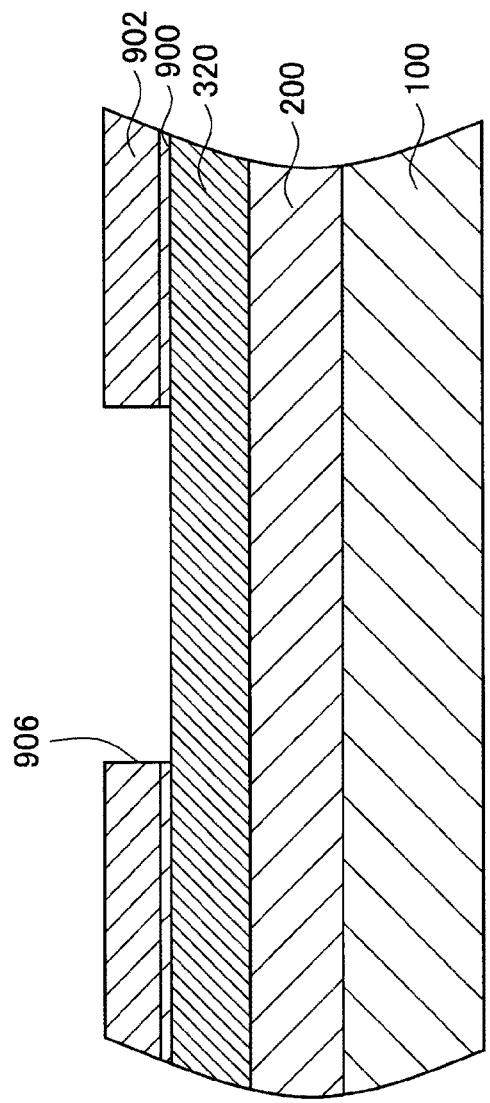
FIG. 6 is a cross-sectional diagram (No. 4) for explaining each process in the method for manufacturing the semiconductor device according to the embodiment of the present disclosure.

Thereafter, dry etching processing is executed on the silicon nitride film 902 and the silicon oxide film 900 by using the resist pattern 904 as a mask. In this way, as illustrated in FIG. 6, after an opening 906 in which a part of the upper surface of the silicon layer 320 is exposed is obtained, the resist pattern 904 is removed. Note that, when the dry etching processing is executed on the silicon oxide film 900, a part of the upper surface of the silicon layer 320 exposed from the opening 906 may be etched.

Figure 7:
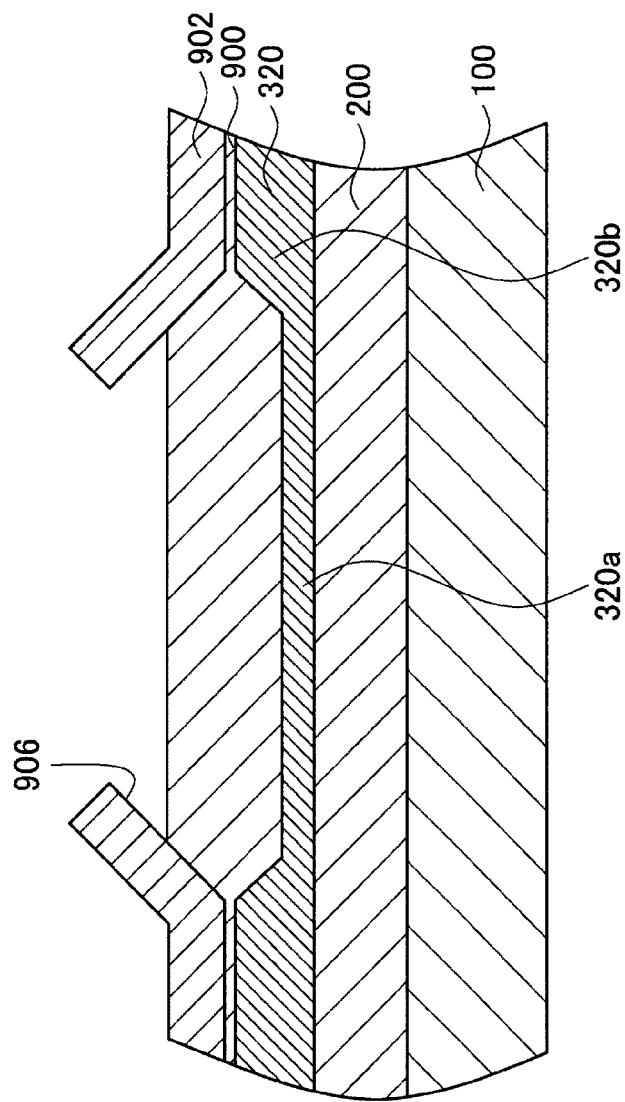
FIG. 7 is a cross-sectional diagram (No. 5) for explaining each process in the method for manufacturing the semiconductor device according to the embodiment of the present disclosure.

Next, as illustrated in FIG. 7, selective oxidation processing (local oxidation of silicon (LOCOS) oxidation processing) is executed on a part of the silicon layer 320 exposed from the opening 906. At this time, an oxidation amount which is an amount of oxidation of the silicon layer 320 made by the oxidation processing is controlled so that the film thickness of the silicon layer 320 positioned in the opening 906 is set to a desired film thickness. More specifically, finally, in a case where a film thickness of a center portion 320a of the silicon layer 320 (in other words, film thickness of thin film portion 300a of diffusion layer 300) is 60 nm, in the process in FIG. 7, it is preferable to control the film thickness of the silicon layer 320 positioned in the opening 906 to be about 80 nm. In this way, the silicon layer 320 is partially thinned.

In other words, in the present embodiment, by forming the silicon layer 320 having a uniform film thickness and selectively oxidizing the center portion 320a of the silicon layer 320, a film thickness of an end 320b of the silicon layer 320 is thicker than the film thickness of the center portion 320a. By the way, as described above, in Patent Document 2, the silicon layer having the above structure has been formed by using the selective epitaxial growth. However, in this case, the manufacturing cost and the manufacturing time have been increased. However, in the present embodiment, the silicon layer 320 having the above structure is formed by executing the selective oxidation processing. According to the present embodiment, since the oxidation processing can be executed more inexpensively and in a shorter time than the selective epitaxial growth, the increases in the manufacturing cost and the manufacturing time in the manufacture of the semiconductor device 10 can be suppressed.

Figure 8:
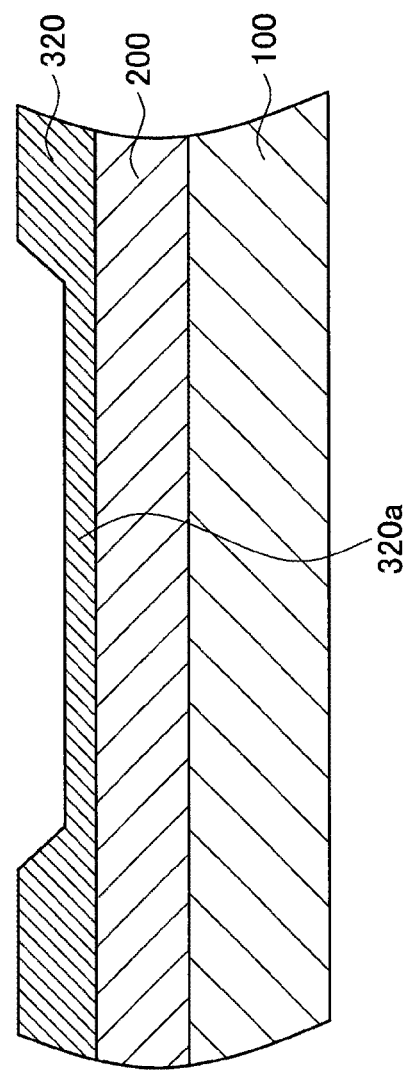
FIG. 8 is a cross-sectional diagram (No. 6) for explaining each process in the method for manufacturing the semiconductor device according to the embodiment of the present disclosure.

Subsequently, when the silicon nitride film 902 is removed by using phosphoric acid, and in addition, the silicon oxide film 900 is removed by using hydrofluoric acid and the like, the silicon layer 320 as illustrated in FIG. 8, in other words, the silicon layer 320 of which the center portion 320a is thinned can be obtained.

Figure 9:
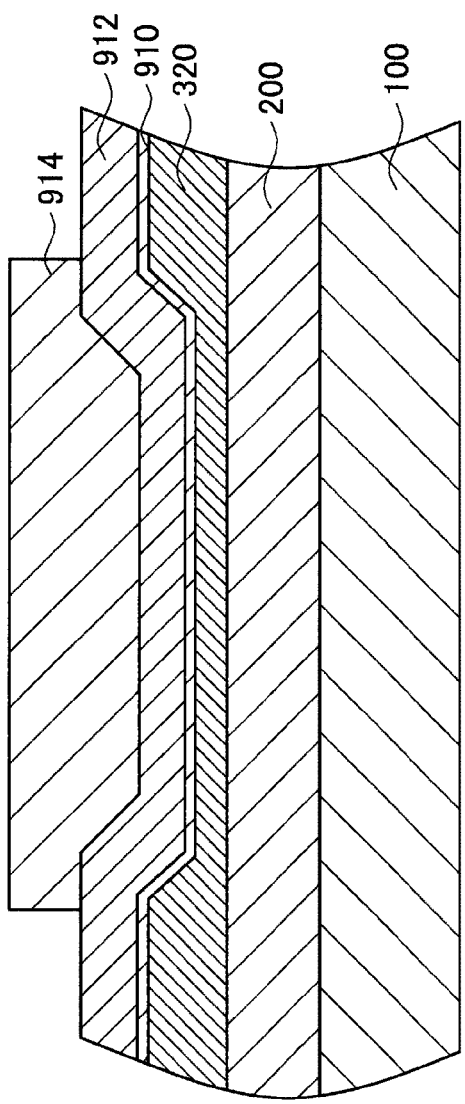
FIG. 9 is a cross-sectional diagram (No. 7) for explaining each process in the method for manufacturing the semiconductor device according to the embodiment of the present disclosure.
Figure 10:
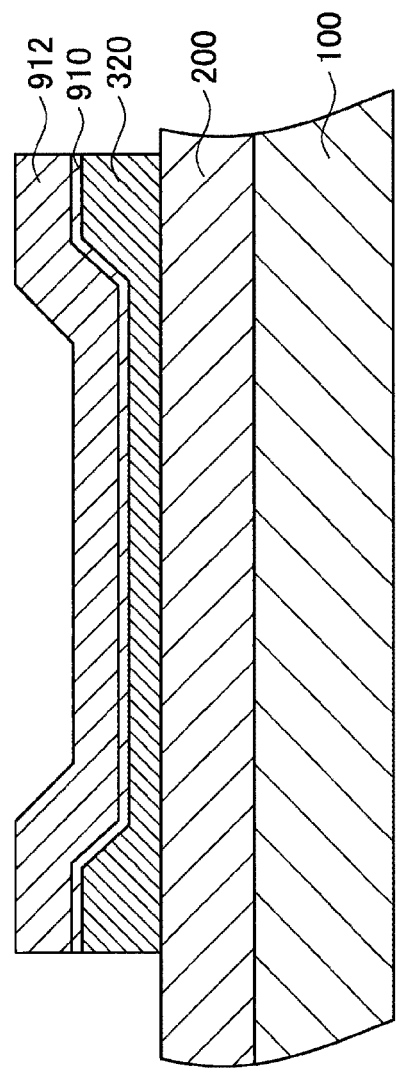
FIG. 10 is a cross-sectional diagram (No. 8) for explaining each process in the method for manufacturing the semiconductor device according to the embodiment of the present disclosure.

Moreover, as illustrated in FIG. 9, by executing the oxidation processing on the upper surface of the silicon layer 320, a silicon oxide film 910 of which a film thickness is 10 nm to 100 nm, preferably 10 nm is formed on the silicon layer 320. Moreover, a silicon nitride film 912 of which a film thickness is 10 nm to 400 nm, preferably 210 nm is formed on the silicon oxide film 910 by using the CVD. Next, the entire surface of the silicon nitride film 912 is coated with a resist and exposed by using photolithography so as to form a resist pattern 914. The resist pattern 914 has a pattern having an opening at a position where the STI 204 for separating the transistor 12 from the other element is formed.

Thereafter, dry etching processing is executed on the silicon nitride film 912 and the silicon oxide film 910 by using the resist pattern 914 as a mask. Moreover, after the upper surface of the silicon layer 320 at the position which is not covered with the resist pattern 914 is exposed, the resist pattern 914 is removed. Note that, in the present embodiment, a method for removing the resist pattern 914 is not particularly limited, and various known removal methods such as ashing can be used. Then, the silicon layer 320 is etched by using the silicon nitride film 912 as a mask by dry etching processing having different conditions from the above dry etching processing, the structure illustrated in FIG. 10 can be obtained.

Figure 11:
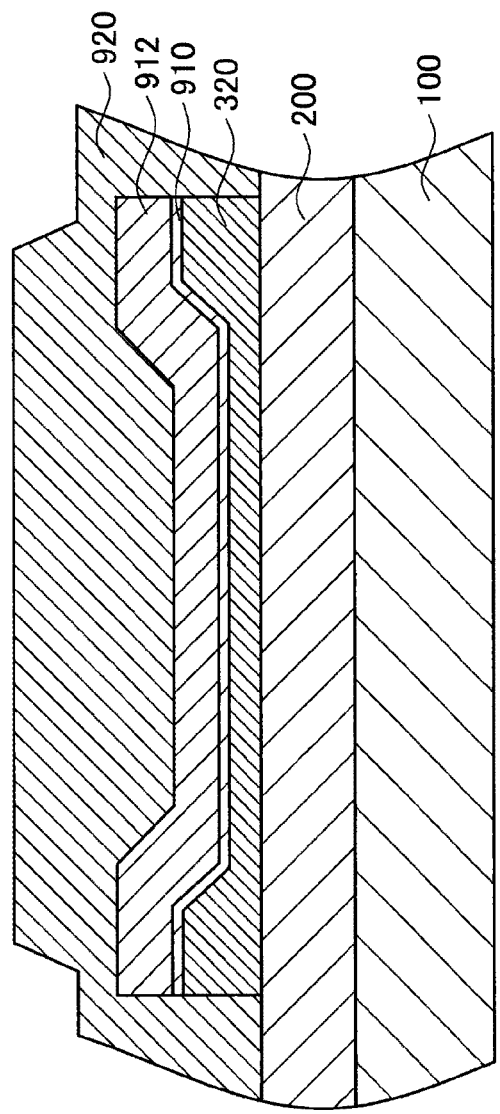
FIG. 11 is a cross-sectional diagram (No. 9) for explaining each process in the method for manufacturing the semiconductor device according to the embodiment of the present disclosure.
Figure 12:
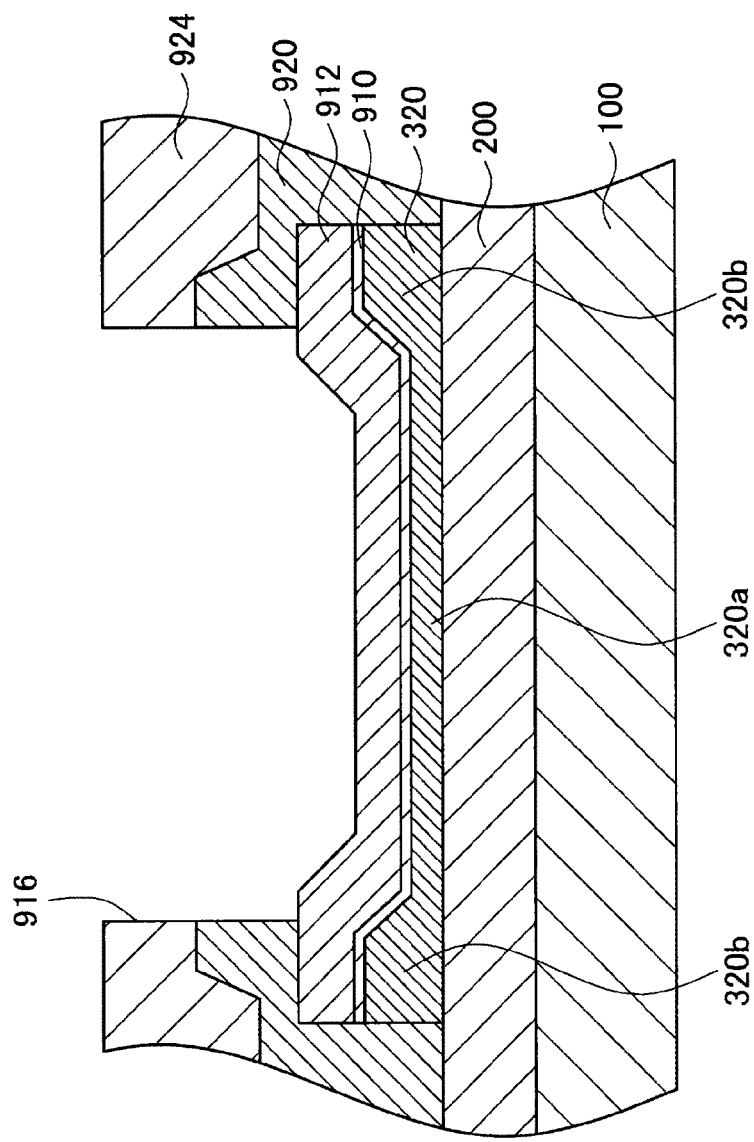
FIG. 12 is a cross-sectional diagram (No. 10) for explaining each process in the method for manufacturing the semiconductor device according to the embodiment of the present disclosure.

Subsequently, as illustrated in FIG. 11, a silicon oxide film 920 is formed on the entire surface of the support substrate 100 so that the silicon oxide film 920 is embedded in trenches provided on both sides of the silicon layer 320 by using a high density plasma (HDP) and the like. At this time, the silicon oxide film 920 may be formed so as to cover the upper surface of the silicon nitride film 912, the film thickness of the silicon oxide film 920 is formed to be 50 nm to 1000 nm, preferably 400 nm.

Next, the entire surface of the silicon oxide film 920 is coated with a resist and exposed by using photolithography so as to form a resist pattern 924. The resist pattern 924 has a pattern having an opening 916 at a position corresponding to the silicon oxide film 910 and the silicon nitride film 912 to be removed which are positioned on the center portion 320a of the silicon layer 320. At this time, it is preferable that the opening 916 extend above the center portion 320a of the silicon layer 320 and further extend to the thick film portion having a thick film thickness of the silicon layer 320 at the end 320b of the silicon layer 320.

Then, the silicon oxide film 920 is removed by executing the dry etching processing on the silicon oxide film 920 by using the resist pattern 924 as a mask. In this way, the structure illustrated in FIG. 12 can be obtained. Note that, according to conditions of chemical mechanical polishing (CMP) to be executed later, there is a possibility that the silicon oxide film 920 remains above the center portion 320a and a region between the center portion 320a and the end 320b where the film thickness of the silicon layer 320 gradually changes. Therefore, to avoid the residual of the silicon oxide film 920, the dry etching processing is preferably executed under an over etching condition in which the silicon nitride film 912 is etched.

Figure 13:
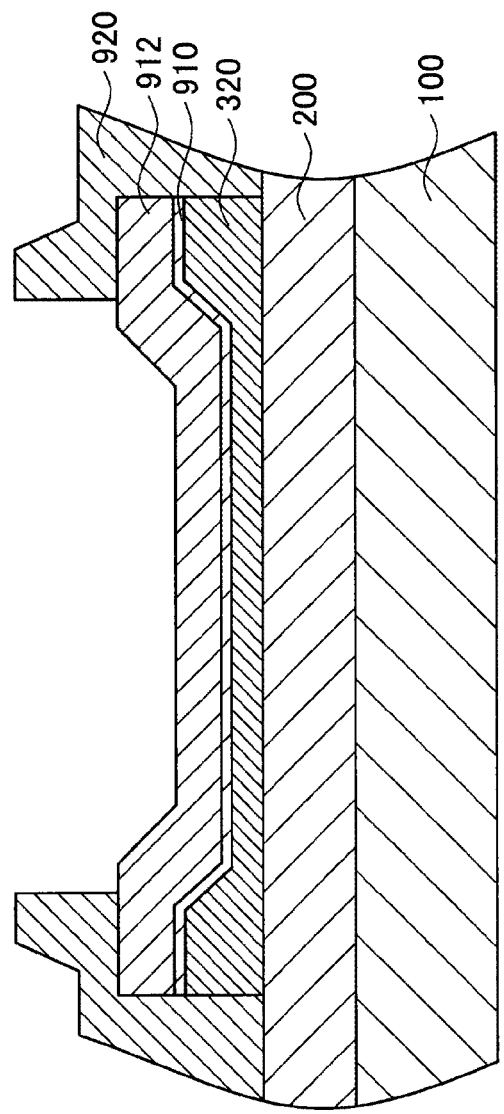
FIG. 13 is a cross-sectional diagram (No. 11) for explaining each process in the method for manufacturing the semiconductor device according to the embodiment of the present disclosure.

Next, as illustrated in FIG. 13, the resist pattern 924 is removed.

Figure 14:
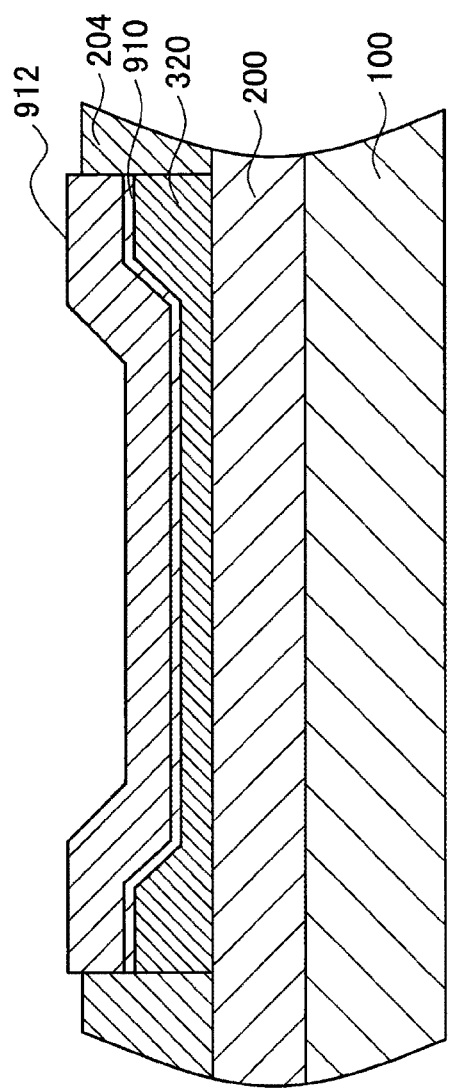
FIG. 14 is a cross-sectional diagram (No. 12) for explaining each process in the method for manufacturing the semiconductor device according to the embodiment of the present disclosure.

Moreover, planarization processing is executed on the upper surface of the support substrate 100 by using the CMP, and the structure illustrated in FIG. 14 can be obtained. Note that the planarized silicon oxide film 920 forms the STI 204 for element separation.

Figure 15:
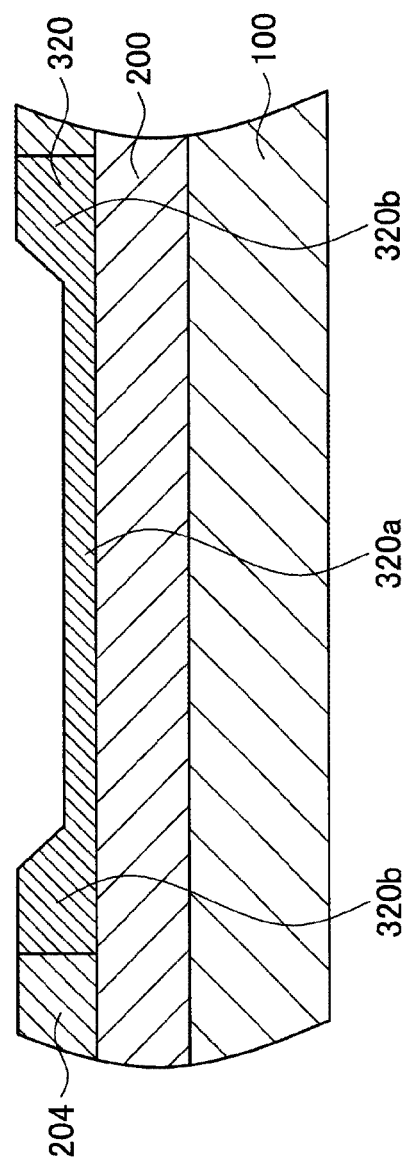
FIG. 15 is a cross-sectional diagram (No. 13) for explaining each process in the method for manufacturing the semiconductor device according to the embodiment of the present disclosure.

Subsequently, when the silicon nitride film 912 is removed by using phosphoric acid, and in addition, the silicon oxide film 910 is removed by using hydrofluoric acid and the like, the structure as illustrated in FIG. 15 can be obtained. In FIG. 15, the silicon layer 320 is surrounded by the silicon oxide film 920 of the STI 204, and in addition, the film thickness of the center portion 320a is thinner than the end 320b. Here, if necessary, for example, an impurity may be implanted into the silicon layer 320 by ion implantation. At this time, by covering the upper surface of the silicon layer 320 with a patterned resist, the impurity may be implanted into a desired portion of the silicon layer 320.

Figure 16:
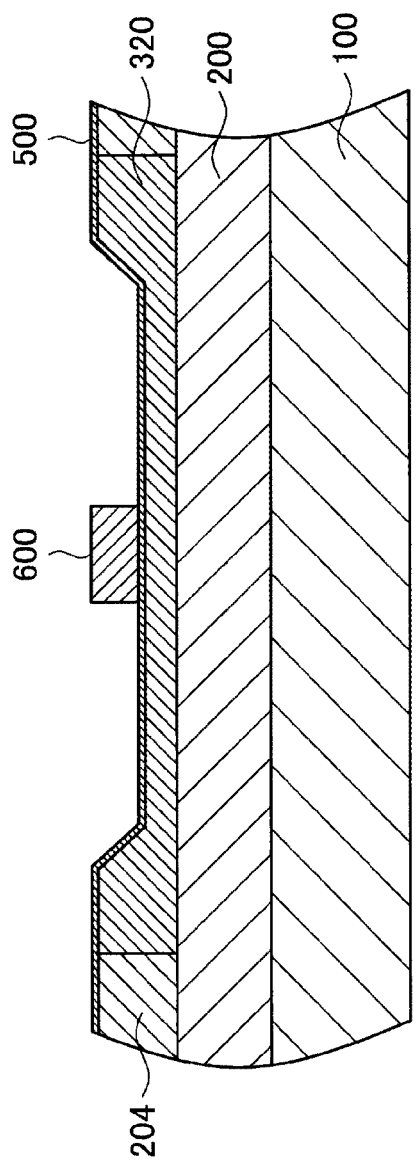
FIG. 16 is a cross-sectional diagram (No. 14) for explaining each process in the method for manufacturing the semiconductor device according to the embodiment of the present disclosure.
Figure 17:
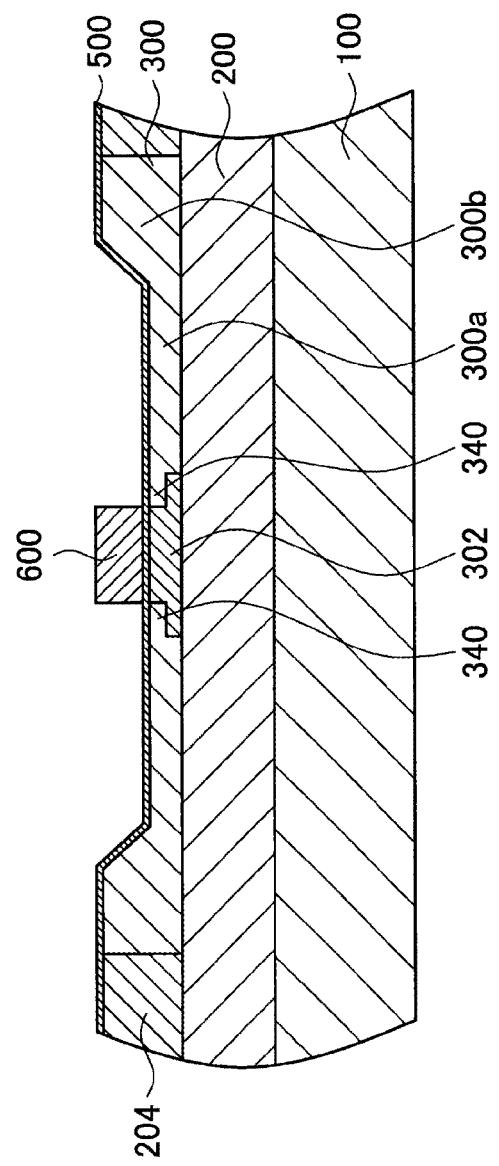
FIG. 17 is a cross-sectional diagram (No. 15) for explaining each process in the method for manufacturing the semiconductor device according to the embodiment of the present disclosure.

Moreover, the gate insulation film 500 formed of a silicon oxide film is formed on the silicon layer 320 and the STI 204. Furthermore, as illustrated in FIG. 16, by forming a polysilicon film on the entire surface on the gate insulation film 500 and further patterning the polysilicon film into an arbitrary shape by using etching and the like, the gate electrode 600 is formed.

Subsequently, the diffusion layer 300 is formed by implanting the impurity into the silicon layer 320 by the ion implantation by using the gate electrode 600 as a mask. Moreover, a desired impurity is implanted around the gate region 302 of the diffusion layer 300 so that an impurity concentration is lower than that in a case of the ion implantation, and a lightly doped drain (LDD) region 340 is formed in the diffusion layer 300. In this way, the structure illustrated in FIG. 17 can be obtained. Note that the above ion implantation may be executed after the LDD region 340 has been formed.

Moreover, patterning is performed on the gate insulation film 500 by performing etching by using the gate electrode 600 as a mask. Thereafter, silicide films 702 may be formed on the exposed upper surface of 300a of the diffusion layer 300 and at positions separated from the gate electrode 600 on both sides of the gate electrode 600. Note that, in the present embodiment, a method for forming the silicide film 702 is not particularly limited, and various known formation methods can be used.

Subsequently, the insulation film 202, the insulation film 400, and the insulation film 802 are sequentially formed on the diffusion layer 300, the STI 204, and the gate electrode 600. Then, a contact via 700 which passes through the insulation film 400 and the insulation film 202 from the insulation film 802 and reaches the silicide film 702 is formed. At this time, in the present embodiment, a source contact via 700 and a drain contact via 700 can be provided so as to be separated by a predetermined distance on the wide thin film portion 300a. Therefore, since it is possible to avoid to perform patterning on the source contact via 700 and the drain contact via 700 with high accuracy, deterioration in the manufacturing yield can be avoided. Furthermore, since the source/drain contact vias 700 can be provided as being separated from each other by a predetermined distance, it is possible to suppress the increase in the layout size of the transistor having the plurality of gates and increase in the manufacturing cost.

Moreover, the source electrode 800a and the drain electrode 800b are respectively formed on the contact vias 700. At this time, methods for forming the insulation film 202, the insulation film 400, the insulation film 802, the contact vias 700, and the source/drain electrodes 800a and 800b are not particularly limited, and a formation method which has been generally used in the method for manufacturing the semiconductor device can be used. Moreover, an additional metal film may be formed on the source electrode 800a and the drain electrode 800b. In this way, the semiconductor device 10 according to the embodiment of the present disclosure illustrated in FIGS. 1A to 1D can be obtained.

As described above, the semiconductor device 10 according to the present embodiment can be manufactured by combining various known methods which have been generally used in the method for manufacturing the semiconductor device. In addition, these methods can be inexpensively executed in a short time, according to the method for manufacturing the semiconductor device 10 according to the present embodiment, the increase in the manufacturing cost can be suppressed.

2.3. Modification

Note that the semiconductor device 10 according to the embodiment of the present disclosure can be modified as follows. Hereinafter, first to seventh modifications of the present embodiment will be described with reference to FIGS. 18 to 24B. Note that the transistor 12 according to the first to fourth modifications has the H-shaped gate electrode 600 as in the above embodiment.

(First Modification)

Figure 18:
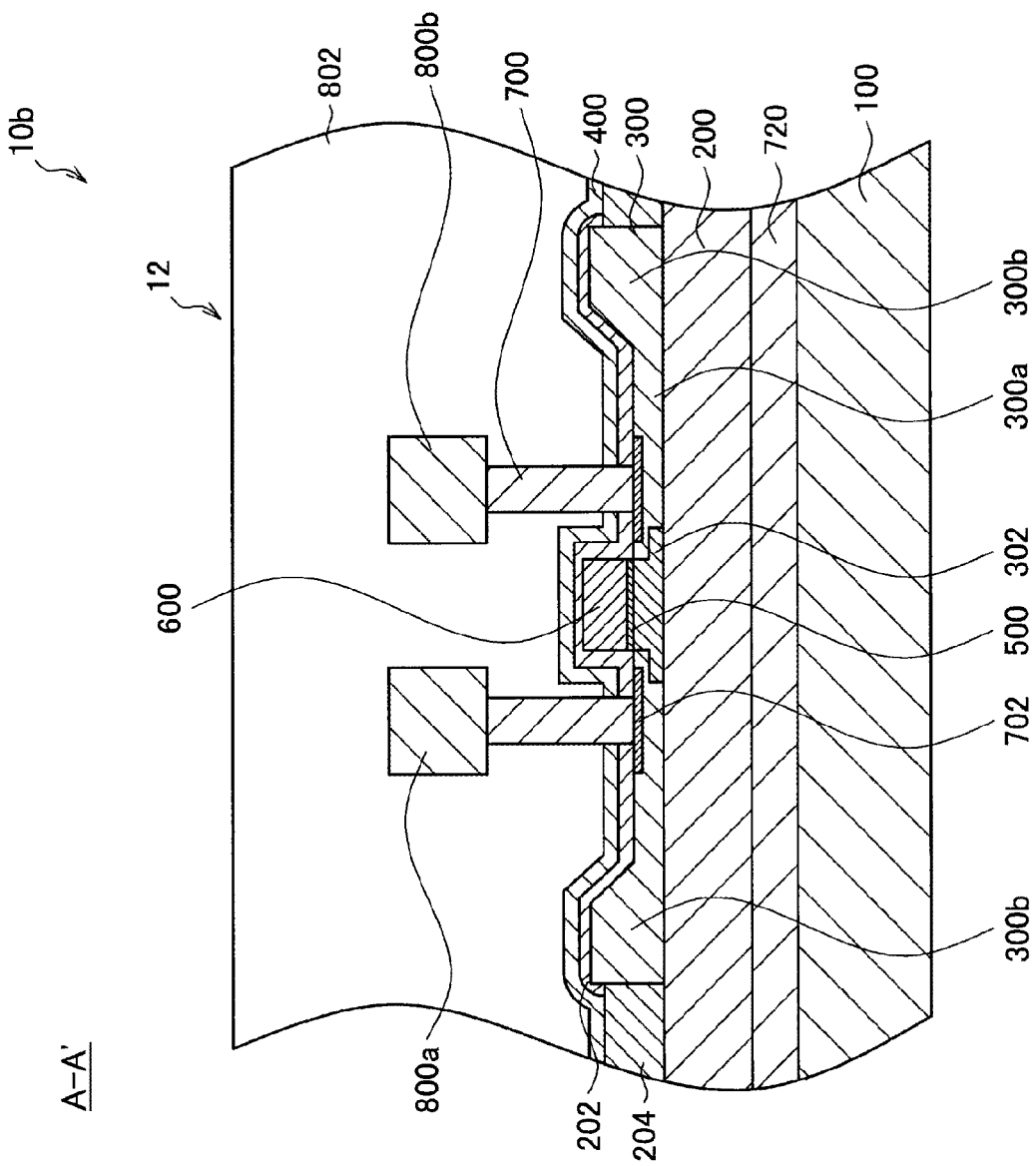
FIG. 18 is a cross-sectional diagram of a semiconductor device 10b according to a first modification of the embodiment of the present disclosure.

First, the first modification will be described with reference to FIG. 18. FIG. 18 is a cross-sectional diagram of a semiconductor device 10b according to the first modification of the present embodiment and is a cross-sectional diagram corresponding to the cross section illustrated in FIG. 1B. As illustrated in FIG. 18, the semiconductor device 10b according to the first modification further includes a silicon layer (other semiconductor layer) 720 formed of polysilicon on the support substrate 100. Then, in the first modification, the embedded insulation film 200 is provided on the silicon layer 720, and the diffusion layer 300 is further provided on the embedded insulation film. Moreover, as in the above embodiment, the diffusion layer 300 includes the thin film portion 300a positioned in the center portion and the thick film portion 300b positioned at the end. In other words, in the present modification, even in a case where a trap-rich type SOI substrate having the silicon layer 720 as a trap-rich layer on the support substrate 100 is used, the diffusion layer 300 having the thin film portion 300a and the thick film portion 300b can be applied.

By the way, it is said that a specific resistance of the support substrate 100 used to form a device for high frequency is desirably high so as to reduce distortion and wraparound of the high frequency. However, in the SOI substrate, as described above, the embedded insulation film 200 formed of a silicon oxide film is provided on the support substrate 100. Then, an inversion layer is easily formed at an interface between the embedded insulation film 200 and the support substrate 100 due to a charge from the embedded insulation film 200 and the like, and there is a case where the specific resistance of the support substrate 100 (specifically, region near surface of support substrate 100) is lowered. Therefore, the substrate on which the silicon layer 720 for trapping the charge is provided to avoid the formation of such an inversion layer is referred to as a trap-rich type SOI substrate. By using such a trap-rich type SOI substrate, the high frequency characteristics can be further enhanced.

(Second Modification)

Figure 19:
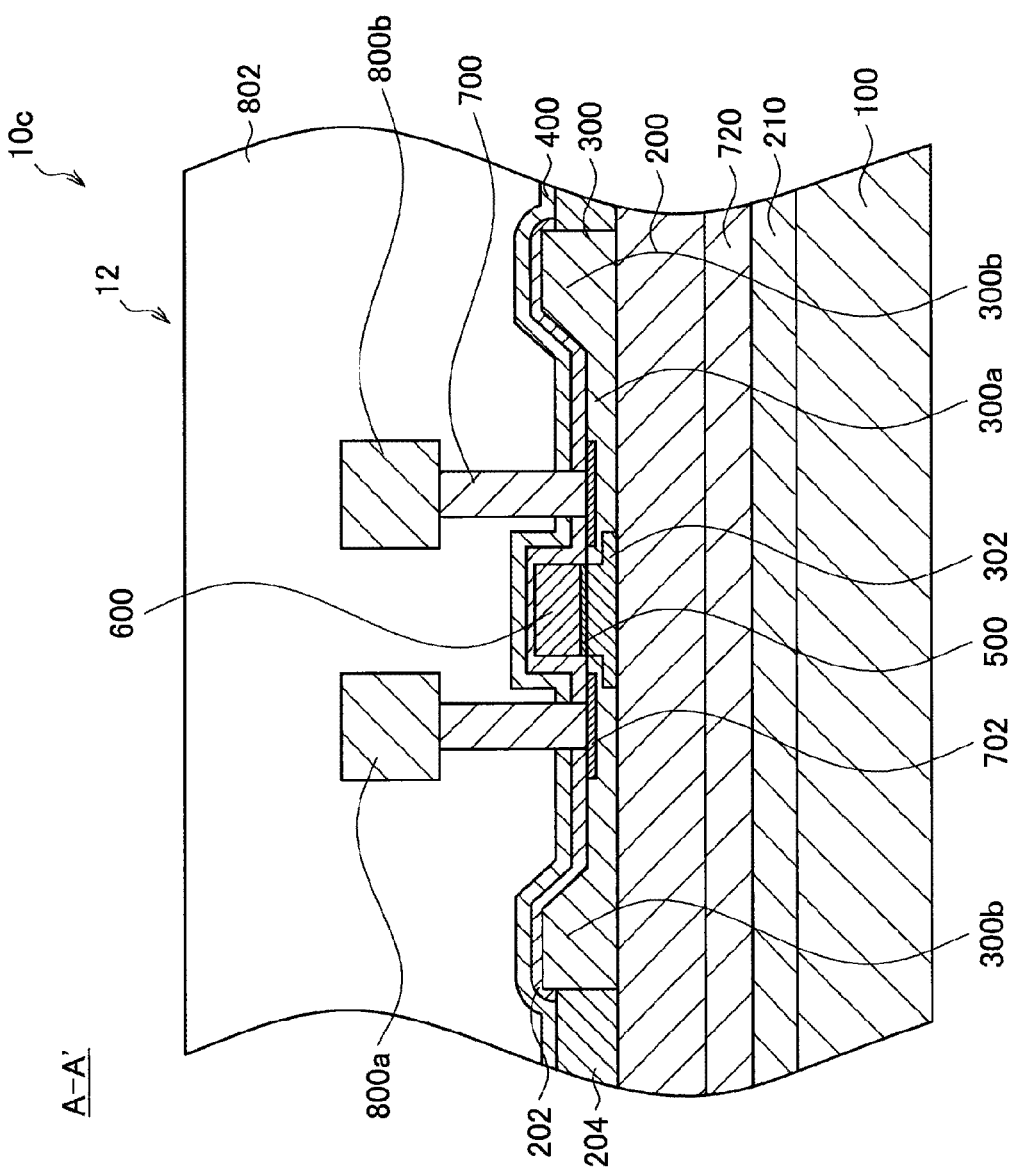
FIG. 19 is a cross-sectional diagram of a semiconductor device 10c according to a second modification of the embodiment of the present disclosure.

Next, the second modification will be described with reference to FIG. 19. FIG. 19 is a cross-sectional diagram of a semiconductor device 10c according to the second modification of the present embodiment and is a cross-sectional diagram corresponding to the cross section illustrated in FIG. 1B. As illustrated in FIG. 19, the semiconductor device 10c according to the second modification further includes an embedded insulation film 210 formed of a silicon oxide film and the silicon layer 720 formed of polysilicon, on the support substrate 100. Then, as in the first modification, in the first modification, the embedded insulation film 200 is provided on the silicon layer 720, and in addition, the diffusion layer 300 is provided on the embedded insulation film 200. In the present modification, the embedded insulation film 210 is provided so as to separate the silicon layer 720 in the first modification from the support substrate 100. Then, as in the embodiment, the diffusion layer 300 includes the thin film portion 300a positioned in the center portion and the thick film portion 300b positioned at the end. In other words, in the present modification, even in a case where a two-step BOX layer type SOI substrate having the two embedded insulation films 200 and 210 as BOX layers on the support substrate 100 is used, the diffusion layer 300 having the thin film portion 300a and the thick film portion 300b can be applied.

Note that, since the two-step BOX layer type SOI substrate as illustrated in FIG. 19 includes the embedded insulation film 210 between the support substrate 100 and the silicon layer 720, even when heating processing is executed at a high temperature, the silicon layer 720 is less likely to recrystallized than the trap-rich type SOI substrate illustrated in FIG. 18. For example, in a case where the silicon layer 720 is single crystallized by recrystallization, there is a case where an impurity from the silicon layer 720 reaches the support substrate 100 and the specific resistance of the support substrate 100 is lowered. However, in a case of the two-step BOX layer type SOI substrate, the silicon layer 720 is hardly recrystallized. Therefore, it is possible to avoid the decrease in the specific resistance of the support substrate 100 due to a mechanism described above. As a result, in a case where a transistor is provided on the two-step BOX layer type SOI substrate, even when high-temperature heating processing is executed, the high specific resistance of the support substrate 100 can be maintained. Therefore, it is possible to maintain excellent high frequency characteristics of the transistor.

In this way, according to the first and second modifications, the present embodiment can be applied to various types of SOI substrates.

(Third Modification)

Figure 20:
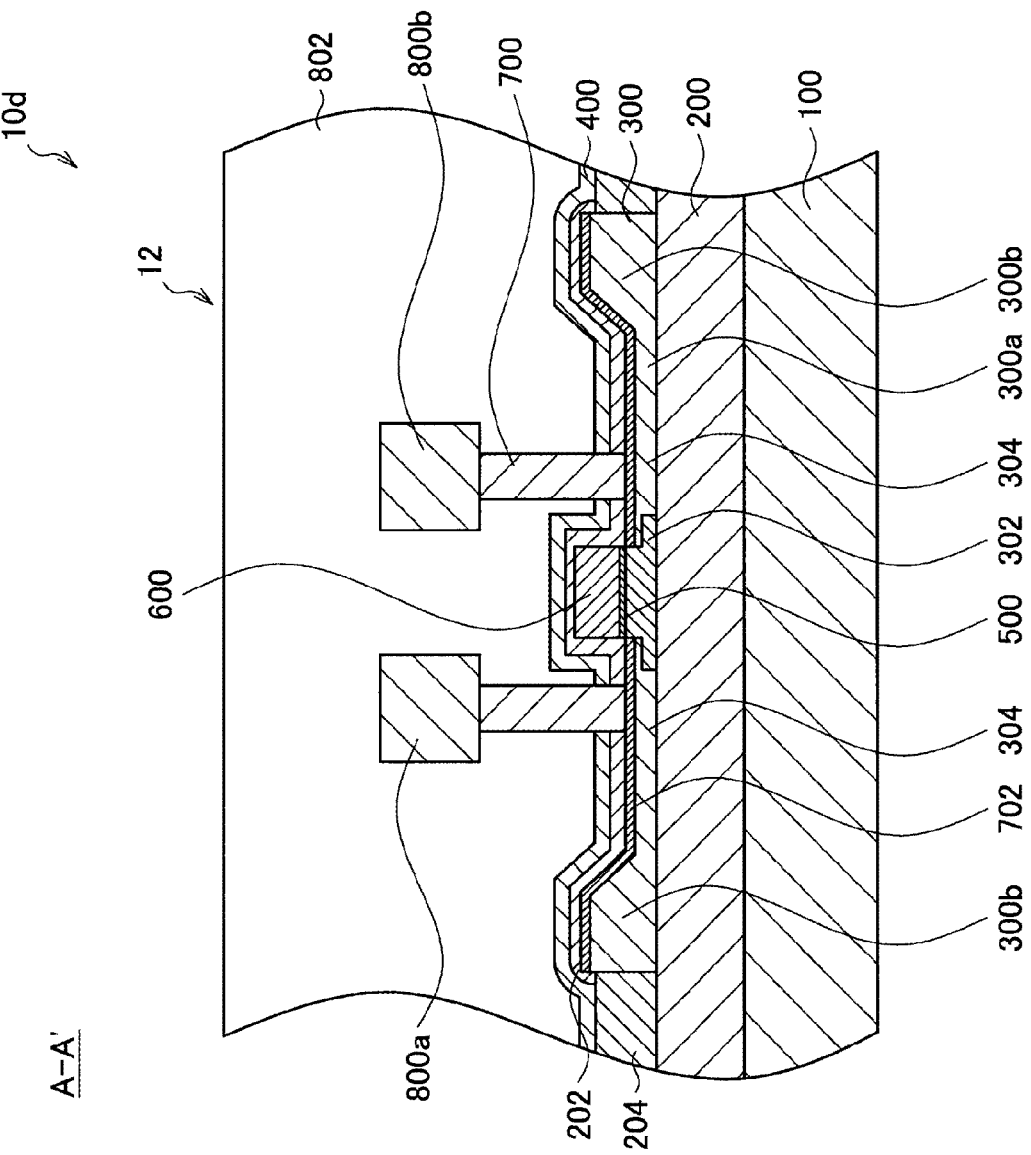
FIG. 20 is a cross-sectional diagram of a semiconductor device 10d according to a third modification of the embodiment of the present disclosure.

Next, the third modification will be described with reference to FIG. 20. FIG. 20 is a cross-sectional diagram of a semiconductor device 10d according to the third modification of the present embodiment and is a cross-sectional diagram corresponding to the cross section illustrated in FIG. 1B. As illustrated in FIG. 20, in the semiconductor device 10d according to the third modification, the silicide film 702 may be provided so as to cover not only the upper surface of the thin film portion 300a of the diffusion layer 300 but also the upper surface of the thick film portion 300b. By providing the wide silicide film 702 in this way, a resistance value between the source region/drain region 304 and the contact via 700 can be reduced. Therefore, the transistor 12 can operate at higher speed.

(Fourth Modification)

Figure 21:
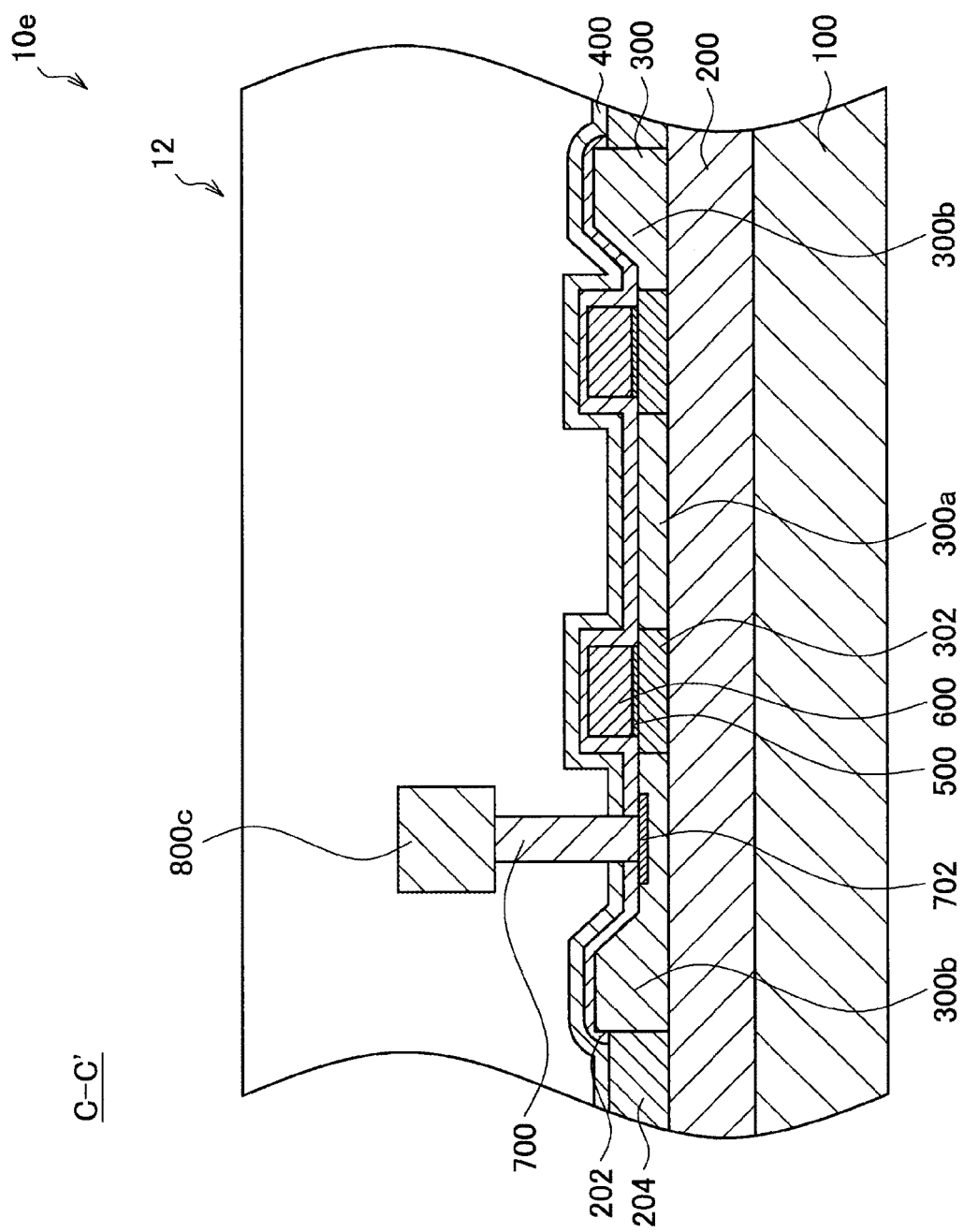
FIG. 21 is a cross-sectional diagram of a semiconductor device 10e according to a fourth modification of the embodiment of the present disclosure.

Next, the fourth modification will be described with reference to FIG. 21. FIG. 21 is a cross-sectional diagram of a semiconductor device 10e according to the fourth modification of the present embodiment and is a cross-sectional diagram corresponding to the cross section illustrated in FIG. 1D. As illustrated in FIG. 21, in the semiconductor device 10e according to the fourth modification, the contact via 700 related to the body contact electrode 800c may be provided on the upper surface of the thin film portion 300a, not on the upper surface of the thick film portion 300b of the diffusion layer 300.

By the way, in the first to fourth modifications described above, the description has been made as assuming that the transistor 12 have the H-shaped gate electrode 600. However, in the present embodiment, the shape of the gate electrode 600 is not limited to this, and may be other shape. In other words, in the present embodiment, a gate structure of the transistor can be freely designed. Therefore, modifications of the gate electrode 600 having various shapes will be described below.

(Fifth Modification)

Figure 22A:
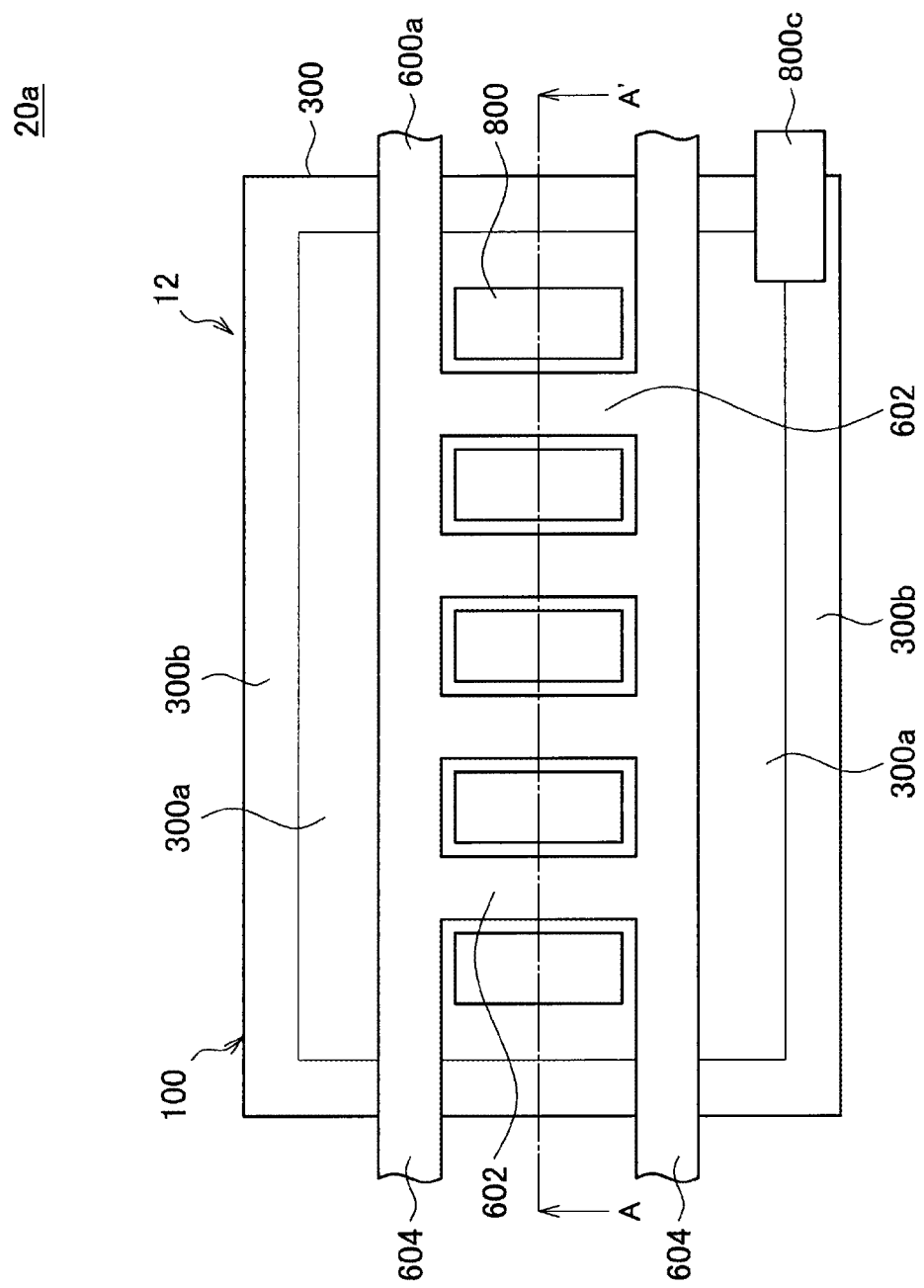
FIG. 22A is a plan view of a semiconductor device 20a according to a fifth modification of the embodiment of the present disclosure.
Figure 22B:
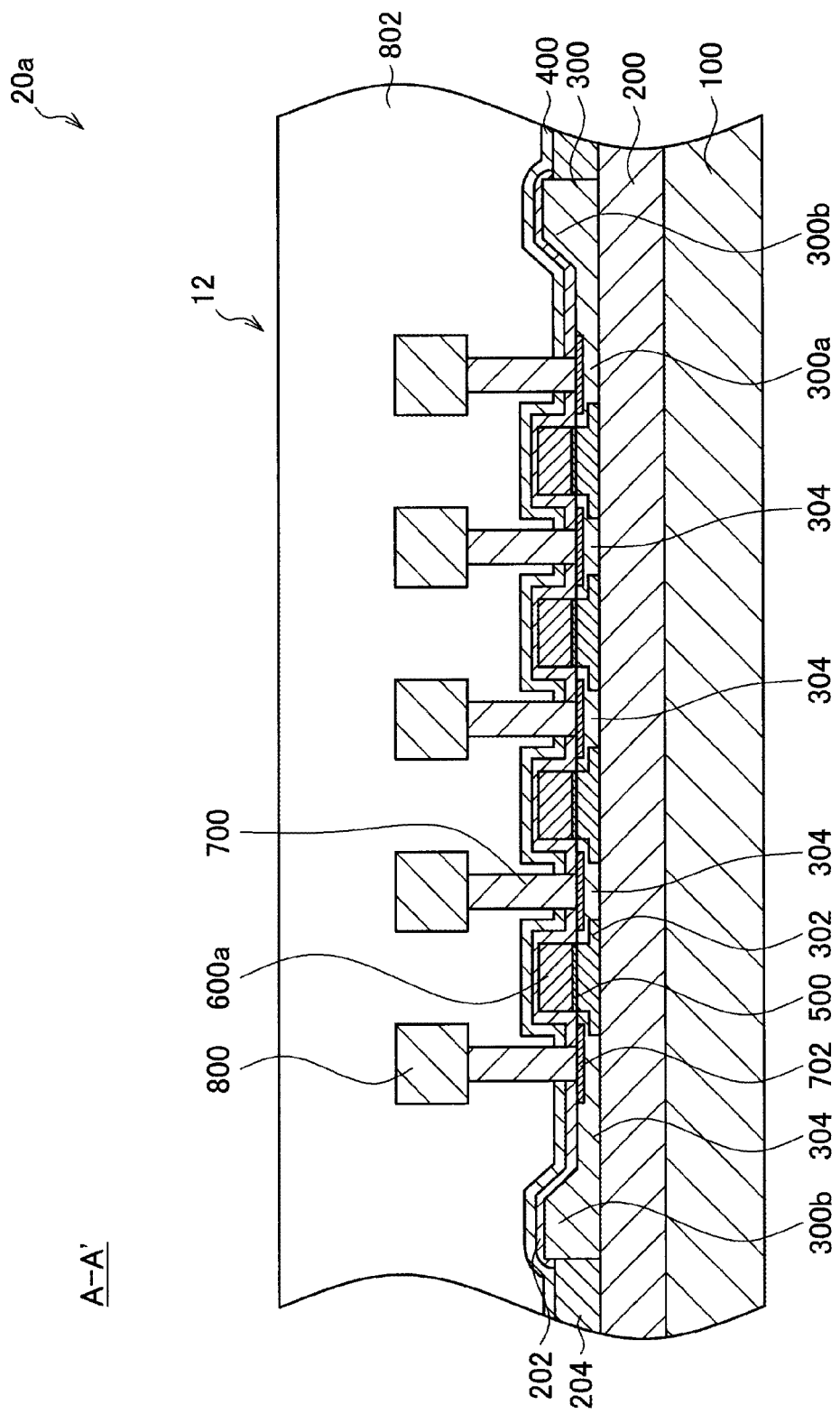
FIG. 22B is a cross-sectional diagram taken along a line A-A' of the semiconductor device 20a illustrated in FIG. 22A.

First, a semiconductor device 20a according to the fifth modification of the embodiment of the present disclosure will be described with reference to FIGS. 22A and 22B. FIG. 22A is a plan view of the semiconductor device 20a according to the fifth modification of the present embodiment. Note that, in FIG. 22A, illustration of the insulation film 202, the insulation film 400, the insulation film 802, and the STI 204 is omitted for easy understanding. FIG. 22B is a cross-sectional diagram taken along a line A-A' of the semiconductor device 20a illustrated in FIG. 22A.

As illustrated in FIG. 22A, the semiconductor device 20a according to the fifth modification has a ladder-shaped gate electrode 600a as viewed from above of the support substrate 100. More specifically, the gate electrode 600a includes a plurality of rectangular electrode portions 602 arranged along the horizontal direction in FIG. 22A and two wiring portions 604 which sandwich the electrode portions 602 along the vertical direction in FIG. 22A and connect the plurality of electrode portions 602. In other words, the plurality of electrode portions 602 and the plurality of wiring portions 604 form the ladder-shaped gate electrode 600a. Moreover, source electrode/drain electrodes 800 are provided so as to sandwich each electrode portion 602 from the left and the right sides in the horizontal direction in FIG. 22A.

Furthermore, in the present modification, as illustrated in FIG. 22B, the diffusion layer 300 includes the thin film portion 300a positioned in the center portion and the thick film portion 300b positioned at the end as in the embodiment. In the present modification, the gate region 302 and the source region/drain region 304 are provided on the thin film portion 300a of the diffusion layer 300. In this way, even in a case where the plurality of gate regions 302 is provided, the diffusion layer 300 having the thin film portion 300a and the thick film portion 300b can be applied.

(Sixth Modification)

Figure 23A:
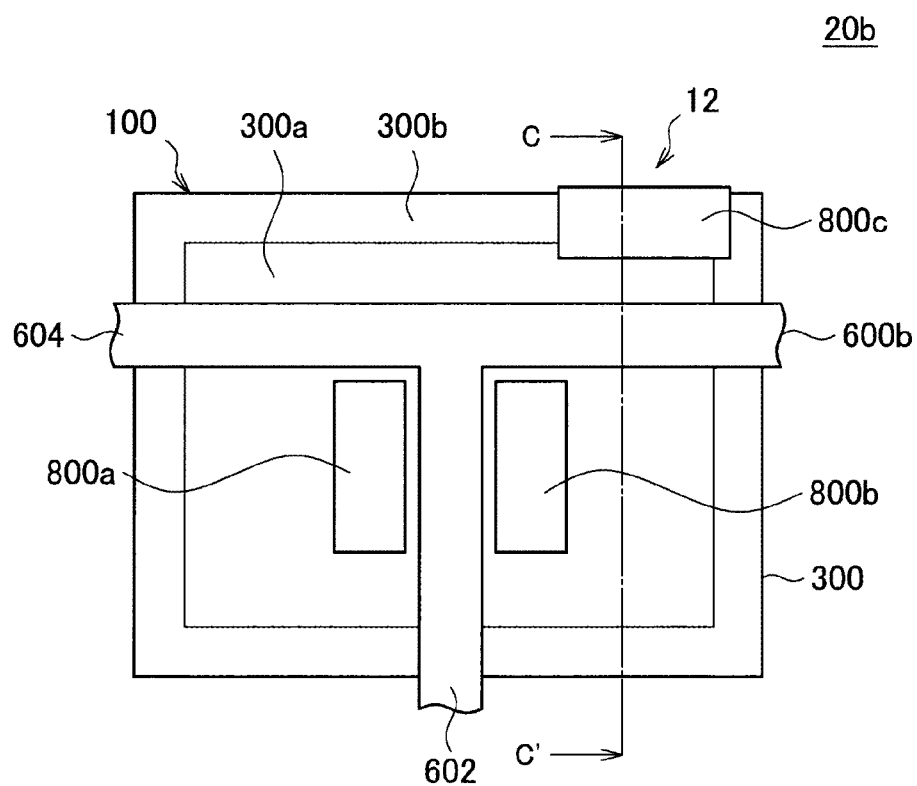
FIG. 23A is a plan view of a semiconductor device 20b according to a sixth modification of the embodiment of the present disclosure.
Figure 23B:
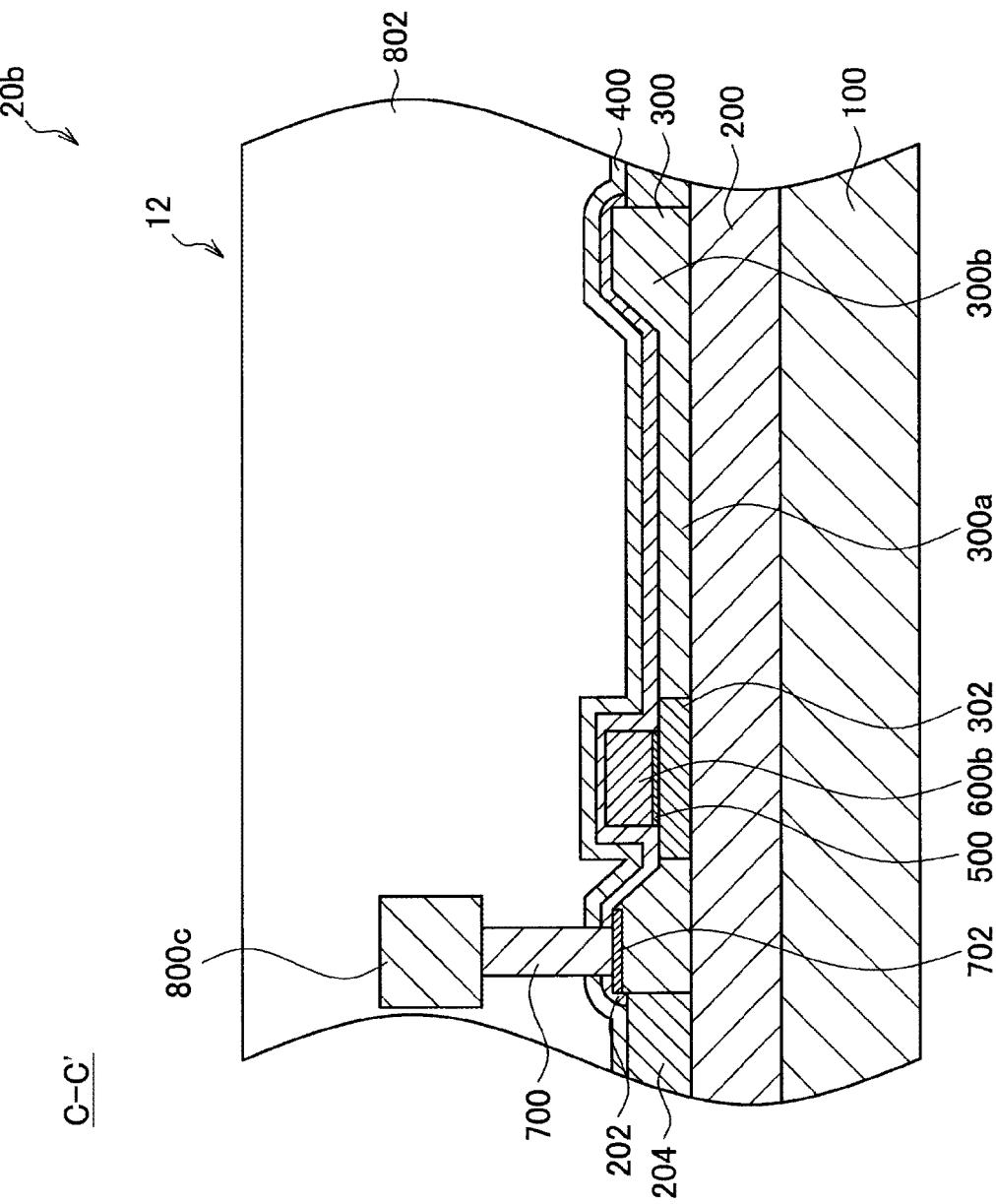
FIG. 23B is a cross-sectional diagram taken along a line C-C' of the semiconductor device 20b illustrated in FIG. 23A.

Next, a semiconductor device 20b according to the sixth modification of the embodiment of the present disclosure will be described with reference to FIGS. 23A and 23B. FIG. 23A is a plan view of the semiconductor device 20b according to the sixth modification of the present embodiment. Note that, in FIG. 23A, illustration of the insulation film 202, the insulation film 400, the insulation film 802, and the STI 204 is omitted for easy understanding. FIG. 23B is a cross-sectional diagram taken along a line C-C' of the semiconductor device 20b illustrated in FIG. 23A.

As illustrated in FIG. 23A, the semiconductor device 20b according to the sixth modification includes a T-shaped gate electrode 600b as viewed from above of the support substrate 100. Specifically, the gate electrode 600b includes the rectangular electrode portion 602 extending along the vertical direction in FIG. 23A and the rectangular wiring portion 604 extending along the horizontal direction in FIG. 23A. Moreover, a center portion of the wiring portion 604 is connected to the electrode portion 602 so as to form the T-shaped gate electrode 600b. Furthermore, source electrode/drain electrodes 800a and 800b are provided so as to sandwich the electrode portion 602 from the right and left sides in the horizontal direction in FIG. 23A.

Furthermore, in the present modification, as illustrated in FIG. 23B, the diffusion layer 300 includes the thin film portion 300a positioned in the center portion and the thick film portion 300b positioned at the end as in the embodiment. In the present modification, the gate region 302 and the source region/drain region 304 are provided on the thin film portion 300a of the diffusion layer 300. In this way, even in a case where the T-shaped gate electrode 600b is provided, the diffusion layer 300 including the thin film portion 300a and the thick film portion 300b can be applied.

(Seventh Modification)

Figure 24A:
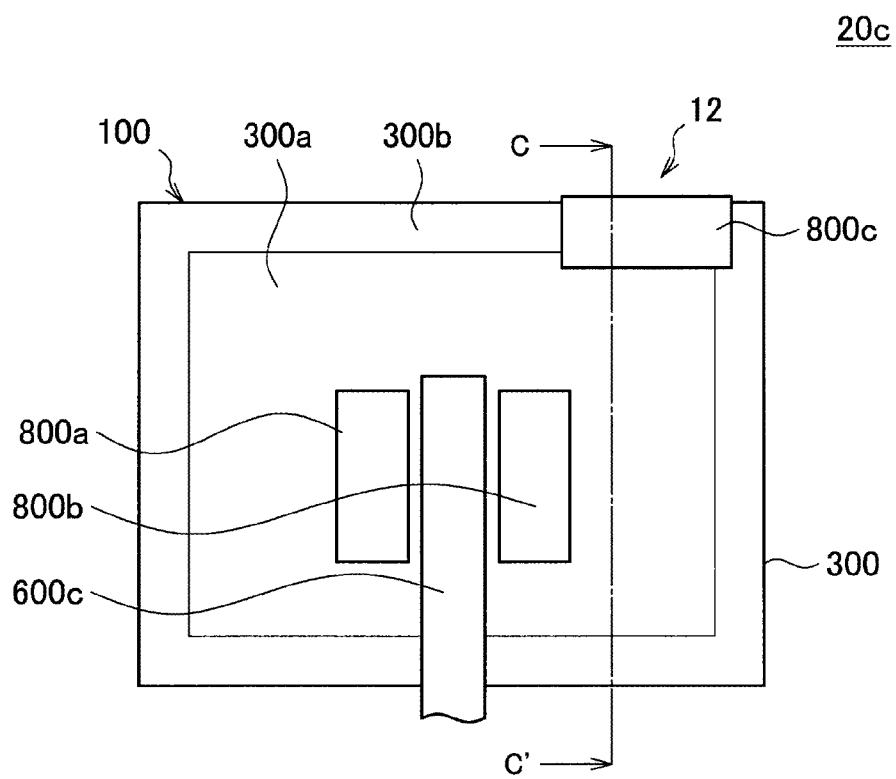
FIG. 24A is a plan view of a semiconductor device 20c according to a seventh modification of the embodiment of the present disclosure.
Figure 24B:
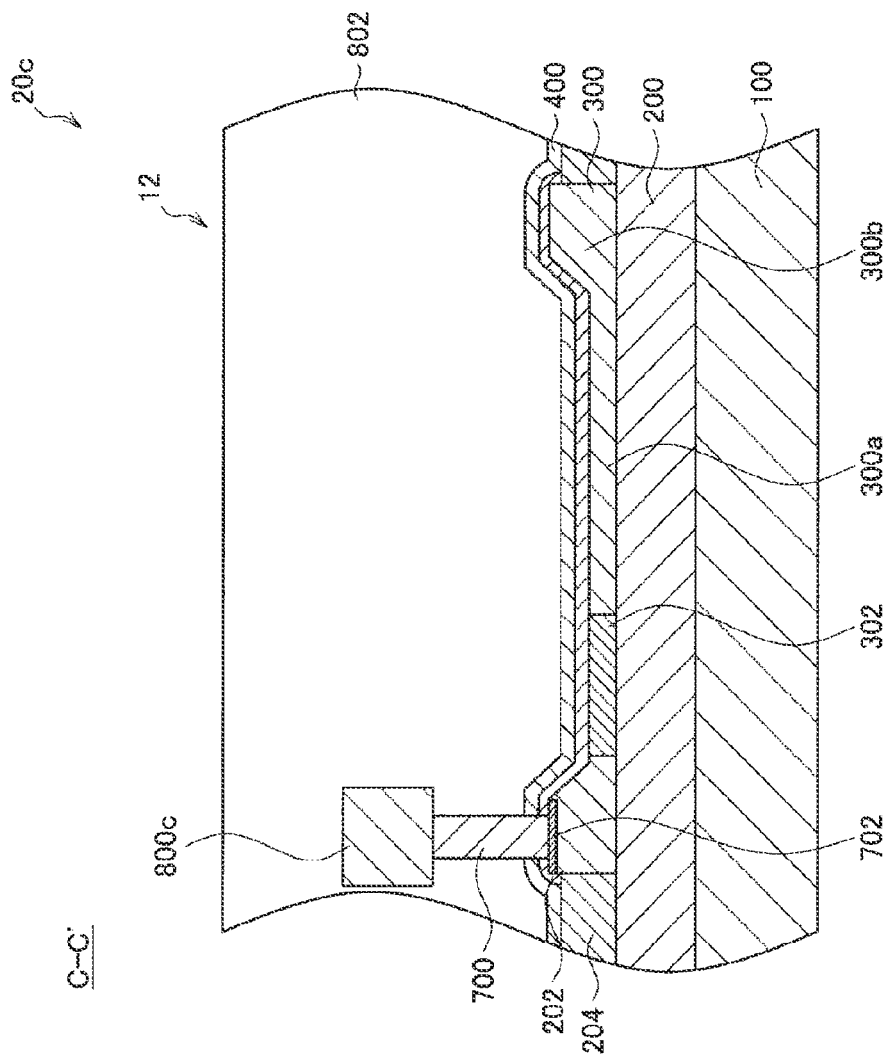
FIG. 24B is a cross-sectional diagram taken along a line C-C' of the semiconductor device 20c illustrated in FIG. 24A.

Next, a semiconductor device 20c according to the seventh modification of the embodiment of the present disclosure will be described with reference to FIGS. 24A and 24B. FIG. 24A is a plan view of the semiconductor device 20c according to the seventh modification of the present embodiment. Note that, in FIG. 24A, illustration of the insulation film 202, the insulation film 400, the insulation film 802, and the STI 204 is omitted for easy understanding. FIG. 24B is a cross-sectional diagram taken along a line C-C' of the semiconductor device 20c illustrated in FIG. 24A.

As illustrated in FIG. 24A, the semiconductor device 20c according to the seventh modification includes an I-shaped gate electrode 600c as viewed from above of the support substrate 100. Specifically, the gate electrode 600c has a rectangular shape extending along the vertical direction in FIG. 24A. Moreover, the source electrode/drain electrodes 800a and 800b are provided so as to sandwich the gate electrode 600c from the right and left sides in the horizontal direction in FIG. 24A.

Furthermore, in the present modification, the diffusion layer 300 includes the thin film portion 300a positioned in the center portion and the thick film portion 300b positioned at the end as in the embodiment. In the present modification, the gate region 302 and the source region/drain region 304 are provided on the thin film portion 300a of the diffusion layer 300. In this way, even in a case where the I-shaped gate electrode 600c is provided, the diffusion layer 300 including the thin film portion 300a and the thick film portion 300b can be applied.

3. Summary

As described above, in the present embodiment, is possible to provide a semiconductor device which can reduce a parasitic capacitance, secure high reliability, and suppress an increase in manufacturing cost.

Specifically, in the present embodiment, the semiconductor device 10 is formed by using the SOI substrate of which the film thickness of the diffusion layer 300 is thin so as to reduce the parasitic capacitance. Moreover, in the present embodiment, the diffusion layer 300 is formed so that the film thickness of the thick film portion 300b is thicker at the end of the diffusion layer 300 where the gate electrode 600 and the diffusion layer 300 overlap with each other. In this way, even in a case where the thermal oxidation processing is executed in the manufacturing process, the film thickness of the end of the diffusion layer 300 is not thinned. Therefore, according to the present embodiment, since the film thickness of the end of the diffusion layer 300 is not thinned, when the semiconductor device 10 operates, the electric field concentration is less likely to occur at the end of the diffusion layer 300, and the breakdown of the gate insulation film 500 is less likely to occur. As a result, according to the embodiment, the semiconductor device which secures high reliability can be provided.

Moreover, according to the present embodiment, since the semiconductor device 10 can be easily obtained by using various known methods used in general in combination in the method for manufacturing the semiconductor device, the increase in the manufacturing cost can be suppressed.

4. Supplement

The preferred embodiment of the present disclosure has been described in detail above with reference to the drawings. However, the technical scope of the present disclosure is not limited to the embodiment. It is obvious that a person who has normal knowledge in the technical field of the present disclosure can arrive at various variations and modifications in the scope of the technical ideas described in claims. It is understood that the variations and modifications naturally belong to the technical scope of the present disclosure.

Furthermore, the effects described in the present description are merely illustrative and exemplary and not limited. That is, the technology according to the present disclosure can exhibit other effects obvious to those skilled in the art from the description in the present specification together with or instead of the above described effects.

Note that the following configuration belongs to the technical scope of the present disclosure.

(1)

A semiconductor device including:

a substrate including an embedded insulation film and a semiconductor layer that is provided on the embedded insulation film and on which a semiconductor element is formed; and a gate electrode provided on the semiconductor layer, in which the gate electrode includes a band-shaped first electrode portion that extends from a center portion of the semiconductor layer and beyond an end of the semiconductor layer along a first direction in a case where the substrate is viewed from above, and in a cross section in a case where the first electrode portion and the substrate are cut along the first direction, a film thickness of the end of the semiconductor layer is thicker than a film thickness of the center portion of the semiconductor layer.

(2)

The semiconductor device according to (1), in which the gate electrode further includes a second electrode portion that extends from the first electrode portion along a second direction perpendicular to the first direction in a case where the substrate is viewed from above.

(3)

The semiconductor device according to (2), in which in a case where the second electrode portion and the substrate are cut along the first direction, the film thickness of the end of the semiconductor layer thicker than the film thickness of the center portion of the semiconductor layer.

(4)

The semiconductor device according to (3), further including:

a source contact via and a drain contact via provided above the center portion of the semiconductor layer so as to sandwich the second electrode portion in a case where the substrate is viewed from above.

(5)

The semiconductor device according to (4), further including:

silicide films provided between the center portion of the semiconductor layer and the source contact via and between the semiconductor layer and the drain contact via.

(6)

The semiconductor device according to (5), in which the silicide film covers the end of the semiconductor layer.

(7)

The semiconductor device according to (2), in which in a case where the second electrode portion and the substrate are cut along the second direction, the film thickness of the end of the semiconductor layer is thicker than the film thickness of the center portion of the semiconductor layer.

(8)

The semiconductor device according to (2), in which the gate electrode includes a plurality of the second electrode portions.

(9)

The semiconductor device according to (1), further including:

a source contact via and a drain contact via provided above the center portion of the semiconductor layer so as to sandwich the first electrode portion along a second direction perpendicular to the first direction in a case where the substrate is viewed from above.

(10)

The semiconductor device according to (1), in which the gate electrode has any one of an H-like shape, a T-like shape, an I-like shape, or a ladder-like shape as viewed from above of the substrate.

(11)

The semiconductor device according to any one of (1) to (10), further including:

a separation insulation film configured to separate the semiconductor element, in which the separation insulation film is provided so as to surround the semiconductor layer as viewing the substrate from above.

(12)

The semiconductor device according to any one of (1) to (11), in which the substrate further includes other semiconductor layer, different from the semiconductor layer, provided below the embedded insulation film.

(13)

The semiconductor device according to (12), in which the substrate further includes other embedded insulation film, different from the embedded insulation film, provided below the other semiconductor layer.

(14)

The semiconductor device according to (1), in which the end of the semiconductor layer has a film thickness twice to ten times of the film thickness of the center portion of the semiconductor layer.

(15)

The semiconductor device according to (1), in which the film thickness of the end of the semiconductor layer is 140 nm to 200 nm, and the film thickness of the center portion of the semiconductor layer is 20 nm to 70 nm.

(16)

The semiconductor device according to (1), further including:

other semiconductor layer, different from the semiconductor layer, on which other semiconductor element different from the semiconductor element is formed, in which the film thickness of the center portion of the semiconductor layer is different from a film thickness of a center portion of the other semiconductor layer.

(17)

The semiconductor device according to (16), in which the film thickness of the center portion of the semiconductor layer is 20 nm to 70 nm, and the film thickness of the center portion of the other semiconductor layer is 140 nm to 200 nm.

(18)

The semiconductor device according to any one of (1) to (17), in which the semiconductor device includes a high frequency antenna switch device.

(19)

A method for manufacturing a semiconductor device, including:

forming a semiconductor layer having a uniform film thickness on a substrate having an embedded insulation film; selectively oxidizing a center portion of the semiconductor layer; and making a film thickness of an end of the semiconductor layer thicker than a film thickness of the center portion.

REFERENCE SIGNS LIST 10, 10a, 10b, 10c, 10d, 10e, 20a, 20b, 20c, 90 Semiconductor device
12, 12a, 92 Transistor
100 Support substrate
200, 210 Embedded insulation film
202, 400, 802 Insulation film
204 STI
300, 310 Diffusion layer
300a Thin film portion
300b Thick film portion
302, 312 Gate region
304 Source/drain region
320, 720 Silicon layer
320a Center portion
320b End
340 LDD region
500 gate insulation film
600, 600a, 600b, 600c Gate electrode
602 Electrode portion
604 Wiring portion
700 Contact via
702 Silicide film
800, 800a, 800b, 800c Electrode
900, 910, 920 Silicon oxide film
902, 912 Silicon nitride film
904, 914, 924 Resist pattern
906, 916 Opening

What is claimed is:

1. A semiconductor device comprising:
a substrate including an embedded insulation film and a semiconductor layer that is provided on the embedded insulation film and on which a semiconductor element is formed;
a gate electrode provided on the semiconductor layer,
wherein the gate electrode includes a band-shaped first electrode portion that extends from a center portion of the semiconductor layer and beyond an end of the semiconductor layer along a first direction in a case where the substrate is viewed from above,
wherein in a cross section in a case where the first electrode portion and the substrate are cut along the first direction, a film thickness of the end of the semiconductor layer is thicker than a film thickness of the center portion of the semiconductor layer,
wherein a silicon oxide film surrounding the semiconductor layer such that the film thickness of the end of the semiconductor layer is thicker than a film thickness of the silicon oxide film, and
wherein a source contact via and a drain contact via are provided on the center portion of the semiconductor layer having a film thickness thinner than the film thickness of the end of the semiconductor layer.

2. The semiconductor device according to claim 1, wherein the gate electrode further includes a second electrode portion that extends from the first electrode portion along a second direction perpendicular to the first direction in a case where the substrate is viewed from above.

3. The semiconductor device according to claim 2, wherein in a case where the second electrode portion and the substrate are cut along the first direction, the film thickness of the end of the semiconductor layer is thicker than the film thickness of the center portion of the semiconductor layer.

4. The semiconductor device according to claim 3, wherein the source contact via and the drain contact via are provided above the center portion of the semiconductor layer so as to sandwich the second electrode portion in a case where the substrate is viewed from above.

5. The semiconductor device according to claim 4, further comprising:
silicide films provided between the center portion of the semiconductor layer and the source contact via and between the semiconductor layer and the drain contact via.

6. The semiconductor device according to claim 2, wherein in a case where the second electrode portion and the substrate are cut along the second direction, the film thickness of the end of the semiconductor layer is thicker than the film thickness of the center portion of the semiconductor layer.

7. The semiconductor device according to claim 2, wherein the gate electrode includes a plurality of the second electrode portions.

8. The semiconductor device according to claim 1, wherein the source contact via and the drain contact via are provided above the center portion of the semiconductor layer so as to sandwich the first electrode portion along a second direction perpendicular to the first direction in a case where the substrate is viewed from above.

* * * * *